United States Patent
Malladi

(10) Patent No.: US 9,686,044 B2
(45) Date of Patent: Jun. 20, 2017

(54) RATE MATCHING WITH MULTIPLE CODE BLOCK SIZES

(75) Inventor: Durga Prasad Malladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1140 days.

(21) Appl. No.: 12/137,431

(22) Filed: Jun. 11, 2008

(65) Prior Publication Data

US 2009/0041110 A1 Feb. 12, 2009

Related U.S. Application Data

(60) Provisional application No. 60/943,545, filed on Jun. 12, 2007, provisional application No. 60/944,579, (Continued)

(51) Int. Cl.
*H04L 27/00* (2006.01)
*H04L 1/00* (2006.01)
(Continued)

(52) U.S. Cl.
CPC ...... *H04L 1/0071* (2013.01); *H03M 13/2957* (2013.01); *H03M 13/635* (2013.01); (Continued)

(58) Field of Classification Search
USPC .......................................... 375/295
See application file for complete search history.

(56) References Cited

U.S. PATENT DOCUMENTS 5,710,595 A * 1/1998 Hang et al. ............... 375/240.05
6,392,572 B1 * 5/2002 Shiu .................. H03M 13/2771
341/81
(Continued)

FOREIGN PATENT DOCUMENTS

EP 1274204 A2 1/2003
JP 2005531967 A 10/2005
(Continued)

OTHER PUBLICATIONS

International Search Report and Written Opinion—PCT/US08/066784, International Searching Authority—Eurgoean Patent Office, Feb. 5, 2009.
(Continued)

*Primary Examiner* — Shuwang Liu
*Assistant Examiner* — Gina McKie
(74) *Attorney, Agent, or Firm* — Changwoo Yang

(57) ABSTRACT

Bits included in each code block of a transport block can be stored to an associated circular buffer and transmitted over a channel. Each circular buffer can vary in size in proportion to a size of the associated code block. Therefore, since in certain operating environments code blocks for a transport block can vary in size, circular buffers can vary in size as well. Accordingly, when not all data from a transport block and/or an array of circular buffers can be transmitted over the channel, each circular buffer from the array can transmit a portion of bits that is proportional to a size of the respective circular buffer (or the associated code block or encoded code block). Furthermore, the number of bits transmitted from each circular buffer can be constrained by an aggregate budget for all circular buffers and can be further constrained to be an integer multiple of a modulation order for the transport block.

30 Claims, 11 Drawing Sheets

Related U.S. Application Data filed on Jun. 18, 2007, provisional application No. 60/956,101, filed on Aug. 15, 2007.

(51) Int. Cl.
*H03M 13/29* (2006.01)
*H03M 13/00* (2006.01)

(52) U.S. Cl.
CPC ............ *H04L 1/005* (2013.01); *H04L 1/0041* (2013.01); *H04L 1/0066* (2013.01); *H04L 1/0067* (2013.01)

(56) References Cited

U.S. PATENT DOCUMENTS

| | | | |
|---|---|---|---|
| 6,522,693 | B1* | 2/2003 | Lu et al. .................. 375/240.02 |
| 6,859,435 | B1* | 2/2005 | Lee et al. ...................... 370/231 |
| 7,227,851 | B1* | 6/2007 | Gopalakrishnan et al. .. 370/335 |
| 8,726,121 | B2 | 5/2014 | Malladi et al. |
| 2002/0084921 | A1* | 7/2002 | Chen et al. ...................... 341/50 |
| 2003/0039224 | A1* | 2/2003 | Koo et al. ...................... 370/328 |
| 2005/0141556 | A1* | 6/2005 | Lu .......................... H04N 19/60 370/468 |
| 2005/0160347 | A1* | 7/2005 | Kim et al. .................... 714/776 |
| 2006/0112168 | A1* | 5/2006 | Albers et al. ................. 709/213 |
| 2006/0195762 | A1 | 8/2006 | Back |
| 2007/0097257 | A1* | 5/2007 | El-Maleh et al. ......... 348/419.1 |
| 2007/0189248 | A1* | 8/2007 | Chang et al. ................. 370/338 |
| 2008/0301536 | A1* | 12/2008 | Shin et al. .................... 714/786 |
| 2009/0077457 | A1* | 3/2009 | Ramesh et al. ............... 714/807 |

FOREIGN PATENT DOCUMENTS

| | | |
|---|---|---|
| RU | 2235439 C2 | 8/2004 |
| RU | 2251804 C2 | 5/2005 |
| WO | WO0130038 A1 | 4/2001 |
| WO | WO03088592 A1 | 10/2003 |
| WO | 2007020678 A1 | 2/2007 |
| WO | WO2008119048 | 10/2008 |

OTHER PUBLICATIONS

Motorola: "Parameters for turbo rate-matching in LTE" R1-071795, Mar. 26-30, 2006; pp. 1-3, XP002510979, St. Julians, Malta, 3GPP TSG RAN1 #48bis.

Nokia Siemens Networks, Nokia: "Way Forward on LTE Rate Matching" 3GPP TSG-RAN Working Group 1 #49, R1-072273, May 7-11, 2007, Kobe, Japan, XP002510977.

QUALCOMM Europe: "Rate Matching for PDSCH and PUSCH" R1-071290, Mar. 30, 2007, pp. 1-9, XP002510978, 3GPP TSG-RAN WG1 #48-bis.

Samsung, QUALCOMM, LGE, ITRI: "Circuiar buffer rate matching for LTE" 3GPP TSG RAN WG1 Meeting #49; R1-072245, May 7-11, 2007, Kobe, Japan, R1-072245, XP002510976.

Samsung, "LTE channel interleaver design for multiple code blocks ", 3GPP TSG RAN WG1#48b R1-071699,Apr. 2007,URL,http://www.3gpp.org/ftp/tsg_ran/WG1_RL1/TSGR1_48b/Docs/R1-071699.zip.

Taiwan Search Report—TW097121973—TIPO—Nov. 4, 2012.

3GPP, "3rd Generation Partnership Project; Technical Specification Group Radio Access Network; Working Group 1; Multiplexing and channel coding", 3GPP TS 25.212, 3rd Generation Partnership Project (3GPP), Mobile Competence Centre; 650, Route Des Lucioles; F-06921 Sophia-Antipolis Cedex; France, No. V1.0.0, Apr. 1999, pp. 1-38.

\* cited by examiner

RATE MATCHING WITH MULTIPLE CODE BLOCK SIZES

CROSS-REFERENCE TO RELATED APPLICATIONS

This application claims the benefit of U.S. Provisional Patent Application Ser. No. 60/943,545 entitled "METHODS AND APPARATUSES FOR RATE MATCHING WITH MULTIPLE CODE BLOCKS AND CODE BLOCK SIZES," which was filed Jun. 12, 2007. This application claims the benefit of U.S. Provisional Patent Application Ser. No. 60/944,579 entitled "METHODS AND APPARATUSES FOR RATE MATCHING WITH MULTIPLE CODE BLOCKS AND CODE BLOCK SIZES," which was filed Jun. 18, 2007. This application also claims the benefit of U.S. Provisional Patent Application Ser. No. 60/956,101 entitled "METHODS AND APPARATUSES FOR RATE MATCHING WITH MULTIPLE CODE BLOCKS AND CODE BLOCK SIZES," which was filed Aug. 15, 2007. This application is related to co-pending U.S. patent application Ser. No. 12/055,195 entitled "CIRCULAR BUFFER BASED RATE MATCHING," which was filed on Mar. 25, 2008 and which claims the benefit of U.S. Provisional Patent Application 60/908,402 filed on Mar. 27, 2007. The entireties of the aforementioned applications are herein incorporated by reference.

BACKGROUND

I. Field

The following description relates generally to wireless communications, and more particularly to utilizing circular buffer based rate matching for transferring data in a wireless communication system.

II. Background

Wireless communication systems are widely deployed to provide various types of communication; for instance, voice and/or data can be provided via such wireless communication systems. A typical wireless communication system, or network, can provide multiple users access to one or more shared resources (e.g., bandwidth, transmit power, . . . ). For instance, a system can use a variety of multiple access techniques such as Frequency Division Multiplexing (FDM), Time Division Multiplexing (TDM), Code Division Multiplexing (CDM), Orthogonal Frequency Division Multiplexing (OFDM), and others.

Generally, wireless multiple-access communication systems can simultaneously support communication for multiple access terminals. Each access terminal can communicate with one or more base stations via transmissions on forward and reverse links. The forward link (or downlink) refers to the communication link from base stations to access terminals, and the reverse link (or uplink) refers to the communication link from access terminals to base stations. This communication link can be established via a single-in-single-out, multiple-in-single-out or a multiple-in-multiple-out (MIMO) system.

Wireless communication systems oftentimes employ one or more base stations that provide a coverage area. A typical base station can transmit multiple data streams for broadcast, multicast and/or unicast services, wherein a data stream may be a stream of data that can be of independent reception interest to an access terminal. An access terminal within the coverage area of such base station can be employed to receive one, more than one, or all the data streams carried by the composite stream. Likewise, an access terminal can transmit data to the base station or another access terminal.

Recently, turbo code, which is a high performance error correction code, has been developed to enhance data transfer over limited-bandwidth communication links in the presence of data corrupting noise. The turbo code can be utilized by any wireless communication apparatus (e.g., base station, access terminal, . . . ) for encoding data to be transmitted by that respective wireless communication apparatus. A turbo code encoder can integrate parity bits with systematic bits (e.g., payload data, . . . ), which increases an overall number of bits to be transmitted by the wireless communication apparatus (e.g., if X bits are inputted to the turbo code encoder, then approximately 3X bits can be outputted from the turbo code encoder).

The overall number of coded bits outputted from the turbo code encoder to be transported over a channel, however, can differ from a number of bits that the wireless communication apparatus is able to send upon the channel (e.g., the number of bits that the wireless communication apparatus is able to send can be a function of an assignment, a property or characteristic of the wireless communication apparatus and/or a wireless communication environment in general, . . . ). For instance, the wireless communication apparatus may be unable to transport all of the coded bits since the number of coded bits can exceed the number of bits that the wireless communication apparatus is able to send upon the channel. Pursuant to another illustration, the number of coded bits can be less than the number of bits that the wireless communication apparatus is able to send upon the channel. Thus, rate matching can be performed to alter the number of coded bits to be sent over the channel to match the number of bits that the wireless communication apparatus is able to send upon the channel; more particularly, rate matching can puncture bits (e.g., delete bits) to decrease the rate (e.g., when the number of coded bits is greater than the number of bits that can be sent upon the channel) or repeat bits to increase the rate (e.g., when the number of coded bits is less than the number of bits that can be sent upon the channel). By way of example, when the number of coded bits is approximately 3X bits (e.g., based upon X bits being inputted to the turbo code encoder) and the approximately 3X bits exceeds the number of bits that, can be sent upon the channel, then fewer than 3X bits can be transmitted from the wireless communication apparatus upon performing rate matching. Conventional rate matching techniques (e.g., such as rate matching in R99, R5, R6, . . . ), however, can be complicated and primarily intended for transport channel multiplexing. For instance, these common rate matching techniques can involve several complicated stages of puncturing or repetition and bit-collection algorithms, which can be further complicated by the fact that in certain operating environments a single transport block can be segmented into code blocks of differing sizes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In accordance with one or more embodiments and corresponding disclosure thereof, various aspects are described in connection with facilitating circular buffer based rate matching with differently sized code blocks for a transport block. Bits included in each code block of a transport block can be stored to an associated circular buffer and transmitted over a channel. Each circular buffer can vary in size in proportion to a size of the associated code block. Therefore, since in certain operating environments code blocks for a transport block can vary in size, circular buffers can vary in size as well. Accordingly, when not all data from a transport block and/or an array of circular buffers can be transmitted over the channel, each circular buffer from the array can transmit a portion of bits that is proportional to a size of the respective circular buffer (or the associated code block or encoded code block). Furthermore, the number of bits transmitted from each circular buffer can be constrained by an aggregate budget for all circular buffers and can be further constrained to be an integer multiple of a modulation order for the transport block.

According to related aspects, a method that facilitates rate matching in a wireless communication environment is described herein. The method can include populating each circular buffer in an array of circular buffers with bits from an associated code block from a set of code blocks constituting a transport block. Further, the method can comprise obtaining a transmission budget defining an aggregate number of bits to be transmitted from all circular buffers in the array. Moreover, the method can include computing a respective buffer budget defining a number of the bits to transmit from an associated circular buffer for each circular buffer in the array, the respective buffer budget accounts for a fraction of the transmission budget and is proportional to a size of the associated circular buffer. Additionally, the method can further comprise constraining the respective buffer budget to an integer multiple of a number of bits described by a modulation order for the transport block.

Another aspect relates to a wireless communications apparatus. The wireless communications apparatus can include a memory that retains instructions related to storing bits from a code block to an associated circular buffer for each code block in a set of code blocks composing a transport block, accessing a transmission budget defining an aggregate number of bits to be transmitted from all circular buffers, and determining a respective buffer budget describing a number of the bits to transmit from the associated circular buffer, the respective buffer budget, accounts for a fraction of the transmission budget and is a function of a size of the associated circular buffer. Further, the wireless communications apparatus can include a processor, coupled to the memory, configured to execute the instructions retained in the memory.

Yet another aspect relates to a wireless communications apparatus that enables employing rate matching in a wireless communication environment. The wireless communications apparatus can include means for populating a circular buffer with data from an associated code block of a transport block. Further, the wireless communications apparatus can include means defining an aggregate amount of data to be transmitted for the transport block. Moreover, the wireless communications apparatus can comprise means for calculating an amount of data to be transmitted from the circular buffer according to a size of the circular buffer relative to other circular buffers.

Still another aspect relates to a machine-readable medium having stored thereon machine-executable instructions for associating each code block of a transport block with a circular buffer in an array of circular buffers; populating a circular buffer in an array of circular buffers with bits from an associated code block; determining a transmission budget defining an aggregate number of bits to be transmitted from all circular buffers in the array; and computing a buffer budget defining a number of the bits to transmit from the circular buffer recursively for each circular buffer in the array, the buffer budget accounting for a percentage of the transmission budget and is proportional to a size of the circular buffer.

In accordance with another aspect, an apparatus in a wireless communication system can include a processor, wherein the processor can be configured to store information included in a code block to an associated circular buffer for each code block of a transport block. Further, the processor can be adapted to configure a transmission budget that defines an aggregate number of bits to be transmitted from all code blocks. Moreover, the processor can be configured to determine a block budget that defines a number of the bits to transmit from the code block, the block budget accounts for a portion of the transmission budget and is a function of a size of the code block relative to other code blocks in the transport block.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments can be employed and the described embodiments are intended to include all such aspects and their equivalents.

DETAILED DESCRIPTION

Figure 1:
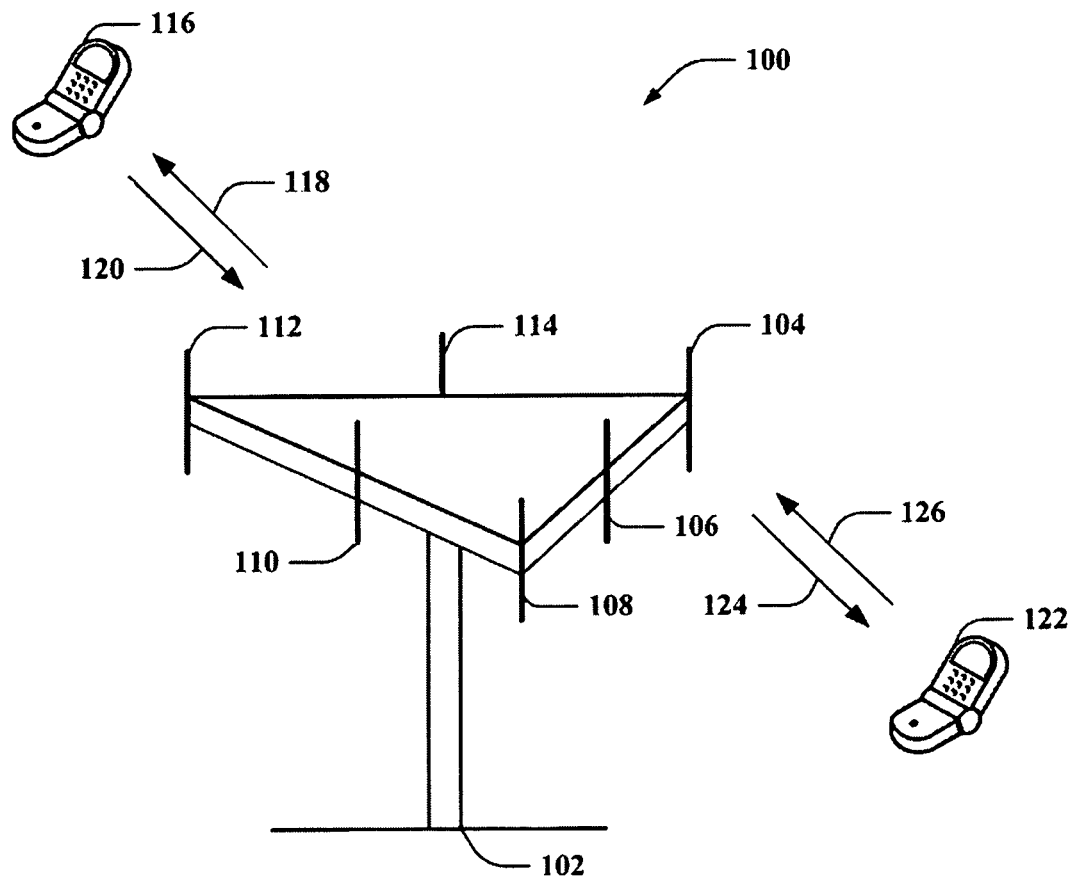
FIG. 1 is an illustration of a wireless communication system in accordance with various aspects set forth herein.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

As used in this application, the terms "component," "module," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Furthermore, various embodiments are described herein in connection with an access terminal. An access terminal can also be called a system, subscriber unit, subscriber station, mobile station, mobile, remote station, remote terminal, mobile device, user terminal, terminal, wireless communication device, user agent, user device, or user equipment (UE). An access terminal can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with access terminal(s) terminals) and can also be referred to as an access point, Node B, eNodeB or some other terminology.

Moreover, various aspects or features described herein can be implemented as a method, apparatus, or article of manufacture using standard programming and/or engineering techniques. The term "article of manufacture" as used herein is intended to encompass a computer, program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

Referring now to FIG. 1, a wireless communication system 100 is illustrated in accordance with various embodiments presented herein. System 100 comprises a base station 102 that can include multiple antenna groups. For example, one antenna group can include antennas 104 and 106, another group can comprise antennas 108 and 110, and an additional group can include antennas 112 and 114. Two antennas are illustrated for each antenna group; however, more or fewer antennas can be utilized for each group. Base station 102 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 102 can communicate with one or more access terminals such as access terminal 116 and access terminal 122; however, it is to be appreciated that base station 102 can communicate with substantially any number of access terminals similar to access terminals 116 and 122. Access terminals 116 and 122 can be, for example, cellular phones, smart phones, laptops, handheld communication devices, handheld computing devices, satellite radios, global positioning systems, PDAs, and/or any other suitable device for communicating over wireless communication system 100. As depicted, access terminal 116 is in communication with antennas 112 and 114, where antennas 112 and 114 transmit information to access terminal 116 over a forward link 118 and receive information from access terminal 116 over a reverse link 120. Moreover, access, terminal 122 is in communication with antennas 104 and 106, where antennas 104 and 106 transmit information to access terminal 122 over a forward link 124 and receive information from access terminal 122 over a reverse link 126. In a frequency division duplex (FDD) system, forward link 118 can utilize a different frequency band than that used by reverse link 120, and forward link 124 can employ a different frequency band than that employed by reverse link 126, for example. Further, in a time division duplex (TDD) system, forward link 118 and reverse link 120 can utilize a common frequency band and forward link 124 and reverse link 126 can utilize a common frequency band.

Each group of antennas and/or the area in which they are designated to communicate can be referred to as a sector of base station 102. For example, antenna groups can be designed to communicate to access terminals in a sector of the areas covered by base station 102. In communication over forward links 118 and 124, the transmitting antennas of base station 102 can utilize beamforming to improve signal-to-noise ratio of forward links 118 and 124 for access terminals 116 and 122. Also, while base station 102 utilizes beamforming to transmit to access terminals 116 and 122 scattered randomly through ah associated coverage, access terminals in neighboring cells can be subject to less interference as compared to a base station transmitting through a single antenna to all its access terminals.

Base station 102, access terminal 116, and/or access terminal 122 can be a transmitting wireless communication apparatus and/or a receiving wireless communication apparatus at a given time. When sending data, the transmitting wireless communication apparatus can encode data for transfer. More particularly, the transmitting wireless communication apparatus can have (e.g., generate, obtain, retain in memory, . . . ) a certain number of information bits to be sent over a channel to the receiving wireless communication apparatus. Such information bits can be included in a transport block of data (or a plurality of transport blocks) that can be segmented to yield a plurality of code blocks. Further, each of the code blocks can be encoded by the transmitting wireless communication apparatus using a turbo code encoder (not shown). The turbo code encoder can output an encoded block for each of the code blocks inputted thereto. The encoded blocks outputted by the turbo code encoder can each include three elements: systematic bits, parity 1 bits, and parity 2 bits.

The transmitting wireless communication apparatus can employ a circular buffer based rate matching algorithm that allows for simplification as compared to conventional techniques (e.g., even in the presence of multiple code blocks and transport blocks). More particularly, circular buffer based rate matching can be effectuated by the transmitting wireless communication apparatus collecting systematic bits of all encoded blocks yielded from a transport block. Further, the collected systematic bits can be interleaved together to yield a first set of bits for sending over a channel. Moreover, the parity 1 bits and the parity 2 bits of all encoded blocks yielded from the transport block can be collected. Upon being collected, the parity 1 bits can be interleaved together. Also, upon being collected, the parity 2 bits can be interleaved together. Thereafter, the interleaved parity 1 bits and the interleaved parity 2 bits can be interlaced together in an alternating manner to yield a second set of bits for sending over the channel. The first and second set of bits can be mapped to wrap around a circular buffer; however, the claimed subject matter is not so limited as use of any type of mapping is contemplated. The transmitting wireless communication apparatus can then transmit bits from the first set (e.g. the systematic bits) over the channel. After transmission of the first set of bits, the transmitting wireless communication apparatus can transmit bits from the second set over the channel.

By separating the systematic bits from the parity 1 and parity 2 bits, circular buffer based rate matching allows for transferring systematic bits prior to transmitting parity bits. Thus, under high code rate conditions where a large number of systematic bits are to be transmitted in a given time period, circular buffer based rate matching can yield improved performance as compared to conventional techniques (e.g., R99 rate matching, R5 rate matching, R6 rate matching; . . . ), while performance can be similar for circular buffer based, rate matching and conventional rate matching techniques under low code rate conditions. More particularly, under high code rate conditions, the transmitting wireless communication apparatus may be unable to transmit all bits of the encoded blocks. Thus, puncturing (e.g., deleting) of bits can be performed for rate matching purposes to reduce the number of bits for communication. In association with puncturing of bits, the transmitting wireless communication apparatus preferentially selects systematic bits for transmission; thus, if possible, all systematic bits from the encoded blocks are transferred via the channel, and if additional bits can be transmitted, then a subset of parity 1 and parity 2 bits are transmitted upon the channel. Further, when a low code rate is utilized, all systematic bits and all parity 1 and parity 2 bits from the encoded blocks can be transferred upon the channel.

Figure 2:
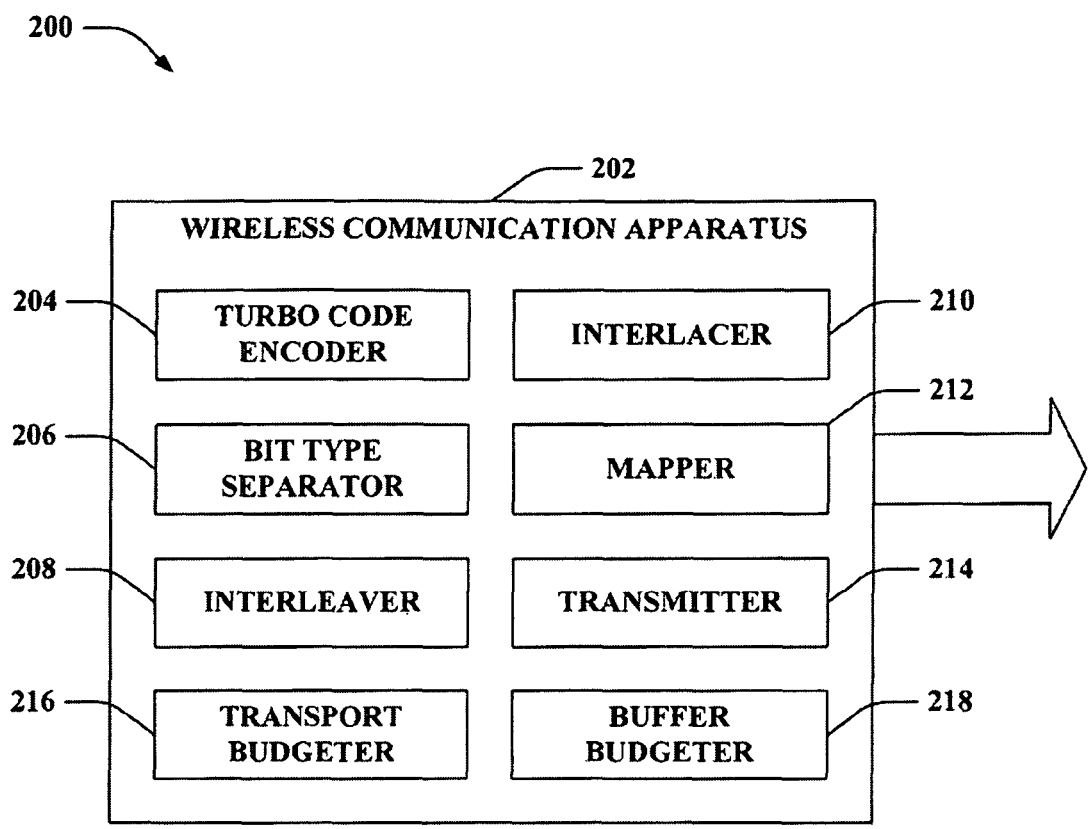
FIG. 2 is an illustration of an example system that performs rate matching utilizing circular buffer based algorithms in a wireless communication environment.

Now turning to FIG. 2, illustrated is a system 200 that performs rate matching utilizing a circular buffer based algorithm in a wireless communication environment. System 200 includes a wireless communication apparatus 202 that is shown to be transmitting data via a channel. Although depicted as transmitting data, wireless communication apparatus 202 can also receive data via die channel (e.g., wireless communication apparatus 202 can concurrent transmit and receive data, wireless communication apparatus 202 can transmit and receive data at differing times, a combination thereof, . . . ). Wireless communication apparatus 202, for instance, can be a base station (e.g., base station 102 of FIG. 1, . . . ), an access terminal (e.g., access terminal 116 of FIG. 1, access terminal 122 of FIG. 1, . . . ), or the like.

Wireless communication apparatus 202 can include a turbo code encoder 204 (e.g., encoder, . . . ) that encodes data to be transferred from wireless communication apparatus 202. Turbo code encoder 204 utilizes a high-performance error correction code to optimize information transfer over a limited-bandwidth connection link in the presence of data-corrupting noise. The input to the turbo code encoder 204 can be one or more code blocks. For example, a transport block can be segmented into M code blocks (e.g., code block 0, code block 1, . . . , code block M−1), where M can be substantially any integer, and these M code blocks can be utilized as input to turbo code encoder 204. Turbo code encoder 204 can output M encoded blocks (e.g., encoded block 0, encoded block 1, . . . , encoded block M−1) based upon the M code blocks inputted thereto. Further, each of the M encoded blocks outputted by turbo code encoder 204 can correspond to a respective inputted one of the M code blocks (e.g., encoded block 0 can be generated based upon code block 0, encoded block 1 can be yielded based upon code block 1, . . . , encoded block M−1 can be generated based upon code block M−1).

The M encoded blocks outputted by turbo code encoder 204 can each include three elements: systematic bits, parity 1 bits, and parity 2 bits. The following provides an example pertaining to one of the M encoded blocks, and it is to be appreciated that the other encoded blocks can be substantially similar. Systematic bits of the encoded block can include payload data. Parity 1 bits of the encoded block can comprise parity bits for the payload data; these parity bits can be generated by turbo code encoder 204 employing a recursive systematic convolution code (RSC code). Further, parity 2 bits of the encoded block can include parity bits for a known permutation of, the payload data; these parity bits can be yielded, by turbo code encoder 204 using an RSC code.

The turbo code utilized by turbo code encoder 204 can be a ⅓ turbo encoding function. Thus, an input of X bits (e.g., X bits included in the M code blocks) to turbo code encoder 204 can yield approximately 3X bits as an output (e.g., approximately 3X bits in the M encoded blocks, 3X+12 bits, . . . ). However, wireless communication apparatus 202 may be unable to send these 3X bits over the channel. Thus, wireless communication apparatus 202 can employ rate matching to convert from these 3X bits down to a lesser number of bits for transfer via the channel.

It is contemplated that turbo code encoder 204 can obtain any number of code blocks as input. For instance, a greater number of code blocks can yield a larger stream of systematic bits, a larger stream of parity 1 bits, and a larger stream of parity 2 bits. Regardless of the size of each of these streams outputted from turbo code encoder 204, wireless communication apparatus 202 can process this output pursuant to the following.

Wireless communication apparatus 202 can further include a bit type separator 206 that divides bits outputted by turbo code encoder 204 into disparate collections. Bit type separator 206 can recognize a type of each of the bits outputted by turbo code encoder 204; thus, bit type separator 206 can determine whether a bit is a systematic bit, a parity 1 bit, or a parity 2 bit. For example, bit type separator 206 can utilize a priori knowledge of operation of turbo code encoder 204 to decipher a type of each of the bits; following this example, turbo code encoder 204 can output systematic bits, parity 1 bits, and parity 2 bits in a predetermined order that can be known by bit type separator 206. Thus, bit type separator 206 can leverage such knowledge to identify systematic bits, parity 1 bits, and parity 2 bits. Upon identifying bit type, bit type separator 206 can collect systematic bits in a first group, parity 1 bits in a second group, and parity 2 bits in a third group.

Moreover, wireless communication apparatus 202 can include an interleaver 208 that interleaves bits for transmission. Interleaver 208 can randomly arrange bits that are interleaved together; thus, Y bits inputted to interleaver 208 in a first sequence can be outputted by interleaver 208 as a randomized, second sequence of the Y bits, where Y can be any integer. For instance, interleaving can protect a transmission again burst errors. By way of illustration, interleaver 208 can be a Quadratic Permutation Polynomial (QPP) Interleaver; however, the claimed subject matter is not so limited. The systematic bits collected in the first group by bit type separator 206 can be interleaved together by interleaver 208 to arrange such bits in a non-contiguous manner. The interleaved systematic bits in the randomized sequence can be denoted as a first set of bits for transmission over a channel. Interleaver 208 can also interleave together parity 1 bits assembled in the second group by bit type separator 206. Further, interleaver 208 can interleave together parity 2 bits collected in the third group by bit type separator 206. Although one interleaver 208 is depicted, it is contemplated that wireless communication apparatus 202 can include more than one interleaver, each of which can be substantially similar to interleaver 208 (e.g., one interleaver can interleave systematic bits while a second interleaver can interleave parity 1 bits and parity 2 bits, a first interleaver can interleave systematic bits, a second interleaver can interleave parity 1 bits, and a third interleaver can interleave parity 2 bits, . . . ).

Wireless communication apparatus 202 can also include an interlacer 210 that interlaces the interleaved parity 1 bits with the interleaved parity 2 bits. Interlacer 210 can create a second set of bits for transmission over the channel from the interleaved parity 1 bits and the interleaved parity 2 bits. Interlacer 210 organizes the interleaved, parity 1 bits and the interleaved parity 2 bits according to a specific ordering; namely, interlacer 210 can alternate between interleaved parity 1 bits and interleaved parity 2 bits. Thus, the output (e.g., the second set of bits for transmission over the channel) from interlacer 210 can be a sequence that alternates between an interleaved parity 1 bit and an interleaved parity 2 bit (e.g., every other bit is a parity 1 bit, every other bit is a parity 2 bit, . . . ). Utilization of interlacer 210 causes parity bits outputted by turbo code encoder 204 to be treated differently as compared to systematic bits outputted by turbo code encoder 204.

Wireless communication apparatus 202 can additionally include a mapper 212 and a transmitter 214. Mapper 212 can insert or populate the first set of bits for transmission yielded by interleaver 208 and the second set of bits for transmission outputted by interlacer 210 into a circular buffer. For instance, the circular buffer can be a fixed size buffer, and the fixed size can be directly related to a size of an associated code block. Thus, mapper 212 can first wrap bits from the first set (e.g., interleaved systematic bits) around the circular buffer. Thereafter, mapper 212 can wrap bits from the second set (e.g., interleaved parity 1 bits and interleaved parity 2 bits interlaced in an alternating fashion) around the circular buffer. Although use of a circular buffer is described, it is to be appreciated that mapper 212 can employ any mapping of bits in the first set and the second set. Further, transmitter 214 can thereafter transfer bits in circular buffer over the channel. Transmitter 214 can, for example, transmit the bits in the circular buffer (or in any other mapping utilized by mapper 212) to a disparate wireless communication apparatus (not shown).

As mentioned, in certain situation, especially under high code rate conditions, wireless communication apparatus 202 may be unable to transmit all bits of the encoded blocks for a given transport block. Appreciably, under such circumstance, some bits from each encoded block (e.g., encoded block 0, encoded block 1 . . . encoded block M−1) of a transport block, which can be stored in an associated circular buffer (e.g., circular buffer 0, circular buffer 1 . . . circular buffer M−1), will not be transmitted by transmitter 214. In cases where all code blocks of a transport block are identical in size, then a number of bits transmitter 214 transmits from each circular buffer can (but need not) also be identical. However, in some operating environments, a given transport block can include code blocks of disparate size. Appreciably, operating in such environments can lead to circular buffers of different size as well as an opportunity to transmit a disparate number of bits from one circular buffer relative to another circular buffer.

Accordingly, wireless communication apparatus 202 can further include transport budgeter 216 and buffer budgeter 218 in order to, inter alia, facilitate rate matching in wireless communication environments with multiple block sizes. Transport budgeter 216 can obtain a transmission budget defining an aggregate number of bits to be transmitted from all circular buffers, wherein each circular buffer in an array of circular buffers can be mapped to and include data from an associated encoded block and/or code block of the transport block. Appreciably, the transmission budget can be predefined or predetermined based upon criteria known or specified in advance, or can be determined based upon discovery or detection of extant conditions.

Buffer budgeter 218 can compute a respective buffer budget for each circular buffer in the array, wherein a buffer budget can define a number of bits from the total transmission budget that an associated circular buffer can transmit. Typically, the buffer budget for a circular buffer is proportional to a size of the circular buffer. Hence, the buffer budget can therefore be based on, as well as proportional to, a size of an associated code block of a given transport block. In accordance therewith, buffer budgeter 218 can apply one or more sets of recursive expressions in order to compute each respective buffer budget, of which three examples are provided infra.

Before continuing the discussion, it should be underscored that the expressions, formulas, equations and so forth provided herein are examples intended to provide a concrete illustration for the sake of understanding. Therefore, any such example provided herein is not necessarily intended to limit the appended claims. Furthermore, it should also be called out that the included example expressions can utilize the following notation:

$N_{d,i}$ = Number of data tones for transport block $i$ $M_i$ = Modulation order for transport block $i$ $C_{i,j}$ = Size of $j^{th}$ code block for transport block $i$ $N_{i,j}$ = Number of code blocks of size $C_{i,j}$ $N_{tb}$ = Number of transport blocks $N_{cb,i}$ = Number of different sized code blocks for transport block $i$ $N_{ij}$ = Total number of code blocks for transport block $i$
$$= \sum_{j=0}^{N_{cbj}-1} N_{i,j}$$

Example 1

Example 1 considers cases in which a different number of bits can be transmitted (e.g., by transmitter 214) from each circular buffer. The number of bits, denoted by K, transmitted from a circular buffer associated with transport block i can be in one embodiment recursively computed using the following equations:

$$K_{i-1} = 0$$

$$K_{i,m} = \left\lfloor \frac{C_{i,m}}{\sum_{j=m}^{N_{ij}-1} C_{i,j}} \cdot \left( N_{d,i} - \frac{1}{M_i} \sum_{j=0}^{m-1} K_{i,j} \right) \right\rfloor \cdot M_i \quad \forall \; 0 \le m \le N_{i,i} - 1$$

In one embodiment, the recursive formula can be applied to the circular buffers in decreasing order of priority. Thus, buffer budgeter can index each circular buffer according to this order of priority. It should be understood that the order of priority can be arbitrary or based upon a particular design format. For instance, consider an example with $N_a$ code blocks of size $C_a$ indexed $\{X_0, X_1, \ldots, X_{N_a-1}\}$ and $N_b$ code blocks of size Cb indexed $\{Y_0, Y_1, \ldots, Y_{N_b-1}\}$. The order of priority can be arbitrary, such as $\{X_0, Y_0 X_1, Y_1 \ldots, X_{N_b-1}, Y_{N_b}-1, \ldots, X_{N_a-2}, X_{N_a-1}\}$ or $\{X_0, X_1, \ldots, X_{N_a-1}, Y_0, Y_1, \ldots, Y_{N_b}-1\}$, or follow a predetermined scheme.

Example 2

Example 2 considers cases in which a substantially identical number of bits can be transmitted (e.g., by transmitter 214) from each circular buffer of substantially the same size. This example handles the last circular buffer size in a different manner than the others. The number of bits transmitted from circular buffers that correspond to code blocks of size $C_{i,m}$ for transport block i can be in one embodiment recursively computed using the following equations:

$$K_{i-1} = 0$$

$$K_{i,m} =$$

$$\left\lfloor \frac{C_{i,m}}{\sum_{j=m}^{N_{cbi}-1} N_{i,j} \cdot C_{i,j}} \cdot \left( N_{d,i} - \frac{1}{M_i} \sum_{j=0}^{m-1} K_{i,j} \right) \right\rfloor \cdot N_{i,m} \cdot M_i \quad \forall \; 0 \le m \le N_{cb,i} - 2$$

For the last circular buffer size, there can be two buffer budgets computed, each with a different size:

$$K_{i,m}^{(1)} = \left\lceil \frac{1}{N_{i,m}} \cdot \left( N_{d,i} - \frac{1}{M_i} \sum_{j=0}^{m-1} K_{i,j} \right) \right\rceil \cdot M_i \quad \forall \; m = N_{cbj} - 1$$

$$K_{i,m}^{(2)} = \left\lfloor \frac{1}{N_{i,m}} \cdot \left( N_{d,i} - \frac{1}{M_i} \sum_{j=0}^{m-1} K_{i,j} \right) \right\rfloor \cdot M_i \quad \forall \; m = N_{cbj} - 1$$

Thus, in one embodiment, the recursive formula can be applied to all circular buffers of a given size according to the decreasing order of priority. It should be appreciated that the formula can apply simultaneously to all circular buffers of the same size.

Example 3

Example 3 considers a hybrid approach of examples 1 and 2, capitalizing on the fact that in certain operating environments, although code blocks for a transport block can differ in size, each transport block will include no more than two different code block sizes. Therefore, in one embodiment, given that there are at most 2 code block sizes, the following simplified equations can be utilized, where:

$N_{i,0}$=Number of code blocks of size $C_{i,0}$
$N_{i,1}$=Number of code blocks of size $C_{i,1}$ The number of modulation symbols available for transmission from all circular buffers associated with code blocks of size $C_{i,0}$ and $C_{i,1}$ can be computed using a first scheme such as:

$$L_{i,0} = \left\lceil \frac{N_{i,0} \cdot C_{i,0}}{(N_{i,0} \cdot C_{i,0}) + (N_{i,1} \cdot C_{i,1})} \cdot N_{d,i} \right\rceil$$

$$L_{i,1} = \left\lfloor \frac{N_{i,0} \cdot C_{i,0}}{(N_{i,0} \cdot C_{i,0}) + (N_{i,1} \cdot C_{i,1})} \cdot N_{d,i} \right\rfloor = N_{d,i} - L_{i,0}$$

For each set of circular buffers and/of code blocks, the exact number of modulation symbols transmitted from the available number can be computed according to a second scheme, e.g.:

$$S_{i,j}^{(m)} = \left\lfloor \frac{L_{i,j}}{N_{i,j}} \right\rfloor \quad \forall \; 0 \le m \le N_{i,0} - 2$$

$$S_{i,j}^{(m)} = L_{i,j} - \sum_{m=0}^{N_{i,j}-2} S_{i,j}^{(m)} \quad \forall \; m = N_{i,j} - 1$$

The above can effectively imply that the number of modulation symbols transmitted from all circular buffers of a certain size is the same, except, perhaps, the last circular buffer of that size. Thus, a total number of allocated modulation symbols per transport block (e.g., the transmission budget obtained or determined by transport budgeter 216) can be split proportionately according to number of circular buffers of each size (e.g., similar code rate across all code blocks).

In one embodiment, the buffer budget for a given circular buffer can be constrained to an integer multiple of a number of bits described by a modulation order (e.g., $M_i$) for transport block i. In accordance therewith, and potentially coupled with a serial transmission of data, these aspects can facilitate implementation of a pipelined decoder architecture with no modulation symbol spanning more than one code block.

The circular buffer based rate matching described herein can involve using one interleaver during Hybrid Automatic Repeat-Request (HARQ) bit insertion into the buffer (e.g., for Evolved Universal Terrestrial Radio Access (E-UTRA)). In contrast, conventional rate matching techniques oftentimes use an additional channel interleaver, which can increase complexity associated with such techniques.

The following example is provided for illustration purposes, and it is to be appreciated that the claimed subject matter is not so limited. According to this example, wireless communication apparatus 202 can input 1000 bits (e.g., from code blocks 0 to M−1, . . . ) to turbo Code encoder 204. Turbo code encoder 204 can process the 1000 bits and output approximately 3000 bits. The 3000 bits can include 1000 systematic bits, 1000 parity 1 bits, and 1000 parity 2 bits. Bit type separator 206 can identify a type of each of the 3000 bits and group the 1000 systematic bits, the 1000 parity 1 bits, and the 1000 parity 2 bits into separate collections. Moreover, interleaver 208 can randomly interleave the 1000 systematic bits together to yield a first set of bits for transmission. Further, interleaver 208 can randomly interleave the 1000 parity 1 bits together. Additionally, interleaver 208 can randomly interleave the 1000 parity 2 bits together. Thereafter, interlacer 210 can combine the randomly interleaved 1000 parity 1 bits and the randomly interleaved 1000 parity 2 bits in an alternating manner (e.g., parity 1 bit, parity 2 bit, parity 1 bit, parity 2 bit, . . . ) to generate a second set of bits for transmission, where the second set of bits includes 2000 bits. Moreover, mapper 212 can insert bits into a circular buffer.

According to an example, 2000 bits can be transmitted by wireless communication apparatus 202 (e.g., 2000 bits can; be inserted into the circular buffer). Thus, mapper 212 can insert the 1000 interleaved systematic bits from the first set into the circular buffer (e.g., mapper 212 can start at a particular location of the circular buffer and clockwise (or counterclockwise) add the sequence of 1000 interleaved systematic bits, . . . ). Additionally, mapper 212 can insert a first 1000 bits from the 2000 bits included in the second set into the circular buffer (e.g., mapper 212 can continue adding the sequence of 1000 parity bits to the circular buffer in a similar manner from an end of the sequence of interleaved systematic bits, . . . ); hence, the remaining 1000 bits need not be inserted into the circular buffer by mapper 212 (e.g., since the circular, buffer can be full). Further, transmitter 214 can send the 2000 bits included in the circular buffer over the channel. By utilizing system 200, the 1000 systematic bits can all be transferred by transmitter 214 since the systematic bits can be preferentially treated as compared to the parity bits (e.g., systematic bits can be considered to be more important than parity bits). Moreover, 500 parity 1 bits and 500 parity 2 bits can be transferred with the remaining resources (e.g., equal weighting can be provided for both parity 1 bits and parity 2 bits, . . . ). Although the aforementioned describes utilization of equal weighting for parity 1 bits and parity 2 bits, if is to be appreciated that any unequal weighting between parity 1 bits and parity 2 bits can be employed.

According to an example, consider a transport block segmented into 2 code blocks (e.g., M=2). Further assume that a transport budget is defined as 200 bits. This implies that only 200 bits from the transport block can be transmitted over the channel from the 2 associated circular buffers. If all code blocks for the transport block are equally sized, then, for example, the first 100 bits from each of the 2 circular buffers can be transmitted. However, if the code blocks differ in size, say, the first code block is twice as large as the second code block, then the first circular buffer can be twice as large as the second circular buffer and, in addition, the buffer budget for the first circular buffer can be twice as large as the buffer budget for the second circular buffer. Thus, the buffer budget can be set proportional to die size of a circular buffer (and/or a size of the associated code block or encoded block). In this manner, the buffer budget for the first circular buffer can be set to 133, and the buffer budget for the second circular buffer can be set to 67 since 133+67=200 and 133 is approximately twice as large as 67.

It should be further appreciated that the buffer budgets can be further based upon the modulation order ($M_i$) for the associated transport block. In particular, the buffer budgets can be constrained to being an integer multiple of the modulation order. Generally, the modulation order will be set based upon certain operating characteristics, such as quadrature phase-shift keying (QPSK, e.g., $M_i$=2), 16-QAM (quadrature amplitude modulation, e.g., $M_i$=4), 64-QAM (e.g., $M_i$=6), and so on. Regardless of the particular modulation order, the buffer budget can be an integer multiple of that modulation order. Therefore, from the example above, assuming the modulation order is 4; then rather than setting the buffer budgets for the two circular buffers to 133 and 67, respectively, these buffer budgets can instead be set to, e.g., 132 and 68, since these latter two values are integer multiples of 4 and the actual values are still proportional to respective buffer sizes.

Moreover, system 200 supports sending multiple transport blocks. Accordingly, if multiple transport blocks are present, rate matching can be done on a per transport block basis.

Figure 3:
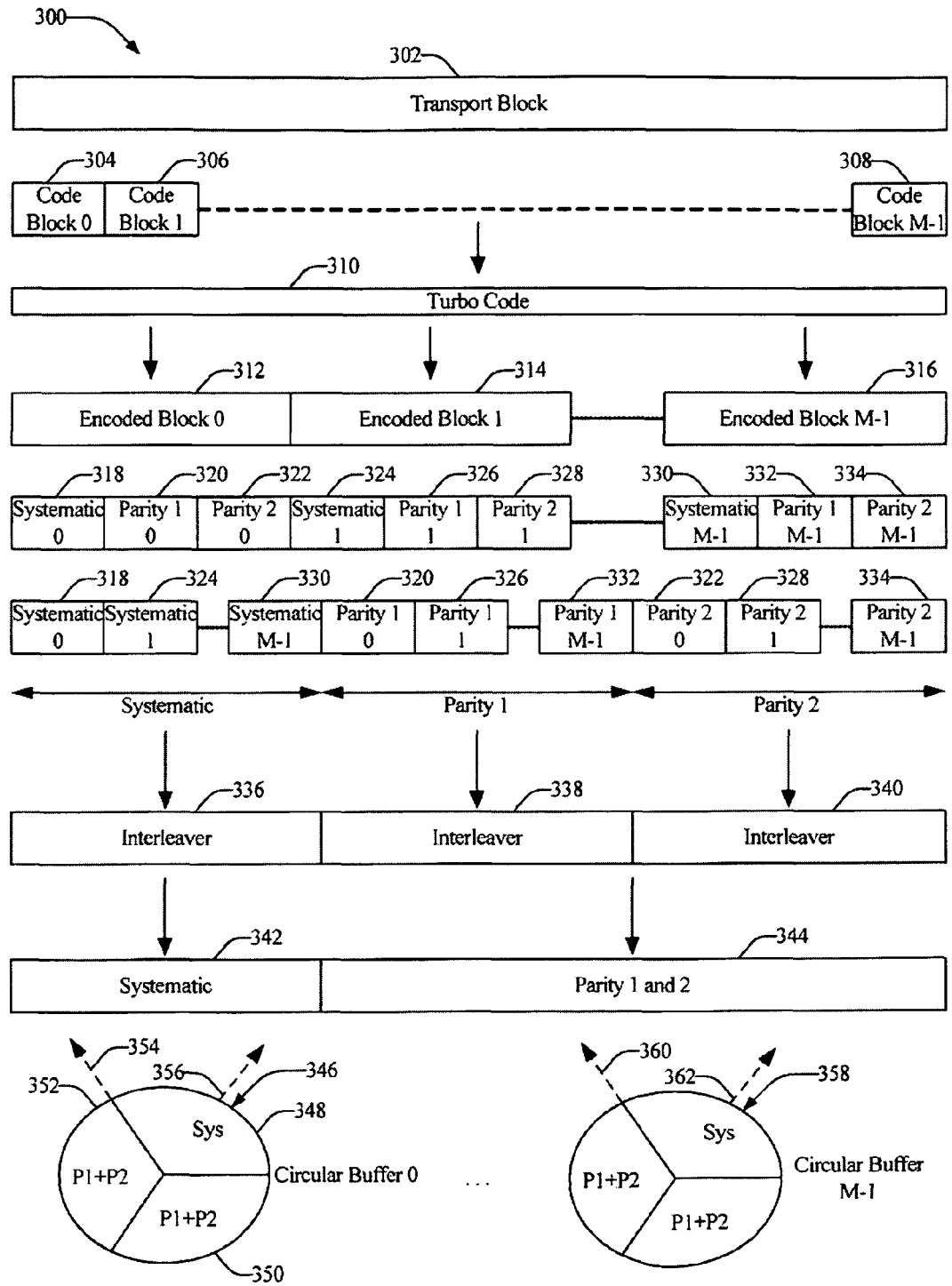
FIG. 3 is an illustration of an example schematic for employing a circular buffer based rate matching algorithm.

Referring to FIG. 3, illustrated is an example schematic 300 for employing a circular buffer based rate matching algorithm. At 302, a transport block can be inputted. The transport block can be segmented into M code blocks (e.g., code block 0 304, code block 1 306, . . . , code block M−1 308), where M can be any integer. The M code blocks can be inputted to turbo coder 310 to yield M encoded blocks (e.g., encoded block 0 312, encoded block 1 314, encoded block M−1 316). Each of the encoded blocks 312-316 can be generated as a function of a respective one of the code blocks 304-308. Each of the encoded blocks 312-316 yielded from the turbo coder 310 can include systematic bits, parity 1 bits, and parity 2 bits. According, encoded block 0 312 can include systematic bits 0 318, parity 1 bits 0 320, and parity 2 bits 0 322, encoded block 1 314 can include systematic bits 1 324, parity 1 bits 1 326, and parity 2 bits 1 328, and encoded block M−1 316 can include systematic bits M−1 330, parity 1 bits M−1 332, and parity 2 bits M−1 334.

Thereafter, each type of bits can be identified and grouped. Thus, systematic bits 0 318, systematic bits 1 324, systematic bits M−1 330 can be recognized as systematic bits and assembled into a first group. Parity 1 bits 0 320, parity 1 bits 1 326, parity 1 bits M−1 332 can be identified as parity 1 bits and collected into a second group. Moreover, parity 2 bits 0 322, parity 2 bits 1 328, . . . and parity 2 bits M−1 334 can be recognized as parity 2 bits and assembled into a third group.

Systematic bits 318, 324, and 330 can be inputted to an interleaver 336 to randomize a sequence thereof: Further, parity 1 bits 320, 326, and 332 can be inputted to an interleaver 338 to randomize a sequence thereof. Moreover, parity 2 bits 322, 328, and 334 can be inputted to an interleaver 340 to randomize a sequence thereof. As shown, separate interleavers 336, 338, and 340 can be utilized for systematic bits 318, 324, and 330, parity 1 bits 320, 326, and 332, and parity 2 bits 322, 328, and 334. According to another illustration (not shown), a common interleaver can be employed for systematic bits 318, 324, and 330, parity 1 bits 320, 326, and 332, and parity 2 bits 322, 328, and 334. Pursuant to a further example, interleaver 336 can interleave systematic bits 318, 324, and 330, while a disparate interleaver (not shown) can interleave parity 1 bits 320, 326, and 332 together and can interleave; parity 2 bits 322, 328, and 334 together (e.g., interleaving of parity 1 bits and parity 2 bits can be separate from each other).

The output of interleaver 336 can be the randomized sequence of systematic bits 342. Moreover, the output of interleavers 338 and 340 can be interlaced together in an alternating manner to yield a sequence of parity 1 and 2 bits 344. The sequence of systematic bits 342 and the sequence of parity 1 and 2 bits 344 can thereafter be inserted into a circular buffer 346. For example, the sequence of systematic bits 342 can first be inserted into the circular buffer 346, and the sequence of parity 1 and 2 bits 344 can thereafter be inserted into the circular buffer 346 utilizing any remaining space. Thus, filling of the circular buffer 0 346 can begin at a particular location with the sequence of systematic bits 342 and proceed clockwise (or counterclockwise) to fill a first section 348 of the circular buffer 346. If the sequence of systematic bits 342 is able to be inserted completely into the circular buffer 346, then the sequence of parity 1 and 2 bits 344 can begin to be inserted in remaining sections 350 and 352 of the circular buffer 346. Although shown as being separate from each other, it is contemplated that sections 350 and 352 can be substantially similar to each other and/or can be combined into one common section (not shown) of the circular buffer 346. The sequence of parity 1 and 2 bits 344 can continue to be inserted around the circular buffer 346 until the end of such sequence 344 is reached or the buffer 346 has no available space remaining.

Appreciably, the above or similar procedure cart be employed to populate each circular buffer, one for each code block in transport block 302. Thus, whereas circular buffer 0 346 corresponds to data from code block 0 304 and/or encoded block 0 312, circular buffer M−1 358 can correspond to code block M−1 308 and/or encoded block M−1 316 and include like constituent parts and information populated in a similar manner as that described in connection with circular buffer 0 346.

When data is transmitted from circular buffers over the channel, each circular buffer transmits bits from a starting point. Here, this starting point is denoted by reference numeral 354 for circular buffer 0 316 and by reference numeral 360 for circular buffer M−1 358, which can be determined based upon a redundancy version (RV) that is utilized. Ideally, all bits included in all circular buffers will be transmitted over the channel, however, when only a portion of the data from transport block 302 can be transmitted over the channel, an ending point can be computed for each circular buffer based upon the a particular circular buffer's starting point and a buffer budget that defines a number of bits the particular buffer can transmit. Ending points are depicted as ending point 356 for circular buffer 0 346 and ending point 362 for circular buffer M−1 358.

Due to code block segmentation, wherein code blocks from transport block 302 can be of differing sizes, ending points for different circular buffers can as well differ. In particular, in an embodiment, the ending point of a circular buffer can be determined by offsetting the starting point with the buffer budget, wherein the buffer budget can be proportional to a size of an associated code block. Thus, for example, if code block 0 304 is a different size than code block M−1 308, then circular buffer 0 346 can be a different size than circular buffer M−1 358, and respective buffer budgets (and therefore ending points) can also differ. Typically, respective buffer budgets will differ in proportion to the size of the associated circular buffer (or code block/encoded block).

Referring to FIGS. 4-7, methodologies relating to effectuating circular buffer based rate matching in a wireless communication environment are illustrated. While, for purposes of simplicity of explanation, the methodologies are shown and described as a series of acts, it is to be understood and appreciated that the methodologies are not limited by the order of acts, as some acts can, in accordance with one or more embodiments, occur in different orders and/or concurrently with other acts from that shown and described herein. For example, those skilled in the art will understand and appreciate that a methodology could alternatively be represented as a series of, interrelated states or events, such as in a state diagram. Moreover, not all illustrated acts can be required to implement a methodology in accordance with one or more embodiments.

Figure 4:
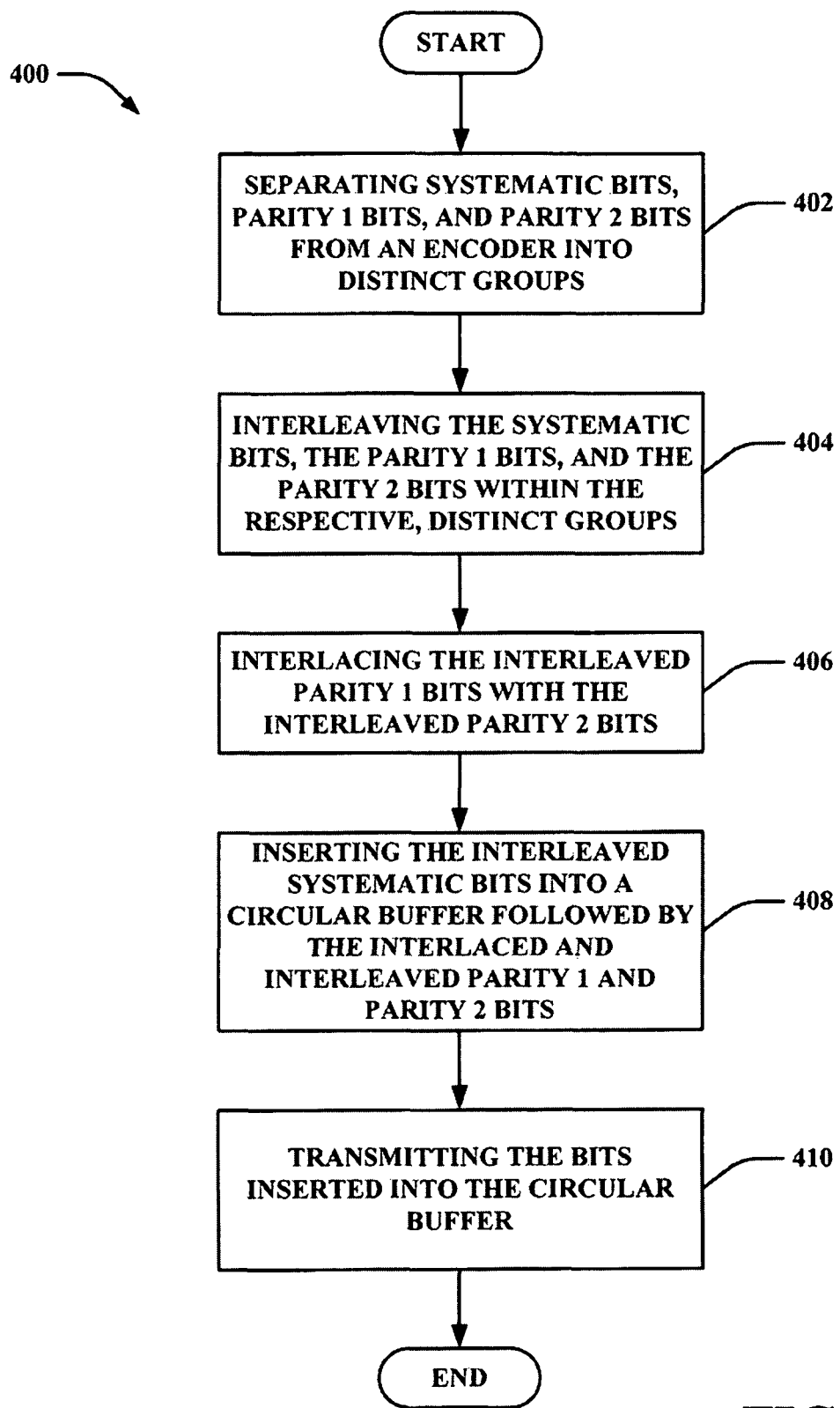
FIG. 4 is an illustration of an example methodology that facilitates rate matching in a wireless communication environment.

With reference to FIG. 4, illustrated is a methodology 400 that facilitates rate matching in a wireless communication environment. At 402, systematic bits, parity 1 bits, and parity 2 bits from an encoder (e.g., turbo coder, . . . ) can be separated into distinct groups. For instance, a transport block can be split into a plurality of code blocks. A turbo code can be applied to each of the plurality of code blocks to yield a plurality of encoded blocks. The encoded blocks outputted by the turbo code can each include systematic bits, parity 1 bits, and parity 2 bits. Moreover, each of these bit types can be recognized to enable the bits to be separated into the distinct groups. At 404, the systematic bits, the parity 1 bits, and the parity 2 bits can be interleaved within the respective, distinct groups. The systematic bits can be interleaved together to randomize an ordering of the systematic bits, the parity 1 bits can be interleaved together to randomize an ordering of the parity 1 bits, and the parity 2 bits can be interleaved together to randomize an ordering of the parity 2 bits; thus, three randomized orderings can be yielded (e.g., one each for the systematic bits, the parity 1 bits, and the parity 2 bits). At 406, the interleaved parity 1 bits can be interlaced with the interleaved parity 2 bits. For example, the randomized ordering of parity 1 bits and the randomized ordering of parity 2 bits can be combined in an alternating fashion where each bit in the interlaced output alternates between being a parity 1 bit or a parity 2 bit. According to another illustration, any disparate, pre-defined pattern can be used to combine the randomized ordering of parity 1 bits with the randomized ordering of parity 2 bits. At 408, the interleaved systematic bits can be inserted into a circular buffer followed by the interlaced and interleaved parity 1 and parity 2 bits. Thus, the interleaved systematic bits can be preferentially selected for inclusion in the circular buffer. Moreover, upon all systematic bits being inserted into the circular buffer, the interlaced parity 1 and parity 2 bits can be incorporated into the circular buffer using any available resources. At 410, the bits inserted info the circular buffer can be transmitted. Thus, for example, if all systematic bits and a portion of the parity 1 and 2 bits fit in the circular buffer, these incorporated bits can be transferred via a channel while a remainder of the parity 1 and 2 bits can be excluded from being sent; however, if all systematic bits as well as all parity 1 and 2 bits fit in the circular buffer, then all such bits can be sent via the channel.

Figure 5:
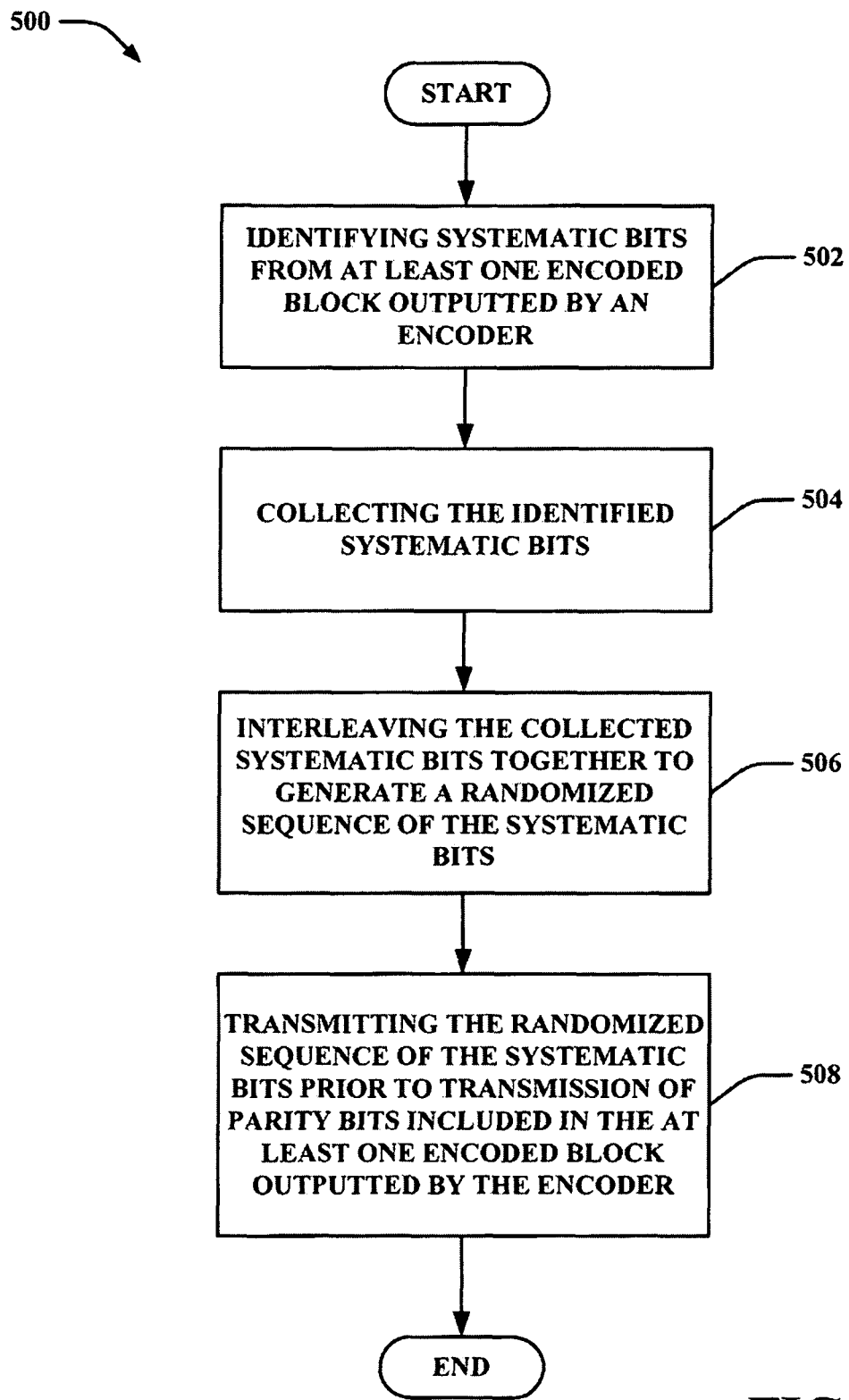
FIG. 5 is an illustration of an example methodology that facilitates preferentially treating systematic bits in connection with circular buffer based rate matching in a wireless communication environment.

Turning to FIG. 5, illustrated is a methodology 500 that facilitates preferentially treating systematic bits in connection with circular buffer based rate matching in a wireless communication environment. At 502, systematic bits from at least one encoded block outputted by an encoder (e.g. a turbo coder, . . . ) can be identified. For instance, the systematic bits can be recognized utilizing a priori knowledge of a format for encoded blocks yielded from the encoder. At 504, the identified systematic bits can be collected. At 506, the collected systematic bits can be interleaved together to generate a randomized sequence of the systematic bits. At 508; the randomized sequence of the systematic bits can be transmitted prior to transmission of parity bits included in the at least one encoded block outputted by the encoder. For instance, the parity bits can include parity 1 bits and parity 2 bits. The randomized sequence of the systematic bits, for instance, can be inserted into a circular buffer prior to inclusion of the parity bits.

Figure 6:
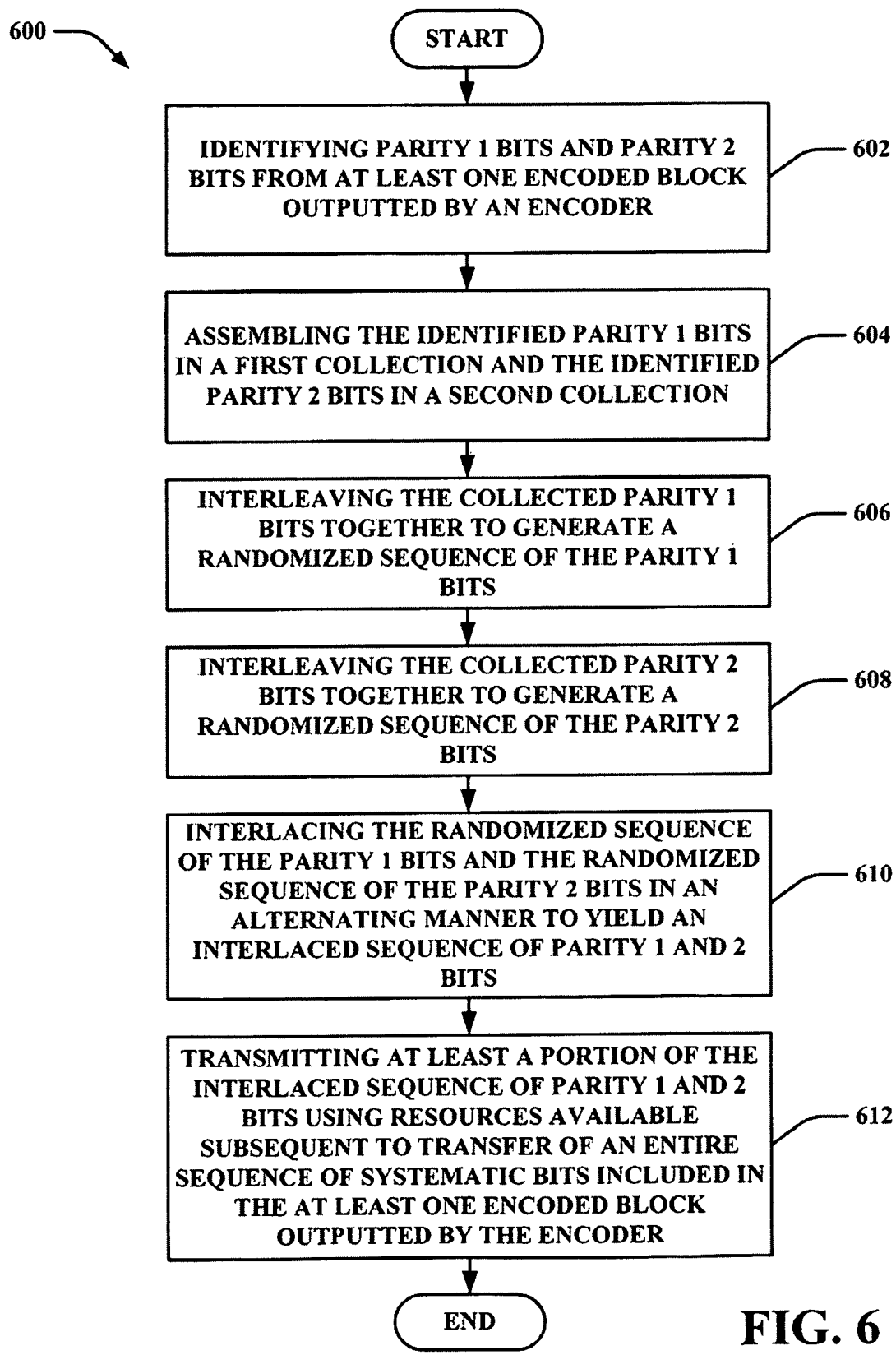
FIG. 6 is an illustration of an example methodology that facilitates employing rate matching using a circular buffer in a wireless communication environment.

Now referring to FIG. 6, illustrated is a methodology 600 that facilitates employing rate matching using a circular buffer in a wireless communication environment. At 602, parity 1 bits and parity 2 bits can be identified from at least one encoded block outputted by an encoder (e.g., a turbo coder, . . . ). The parity 1 bits and the parity 2 bits, for example, can be recognized using a priori knowledge of a format for encoded blocks generated from the encoder. At 604, the identified parity 1 bits can be assembled in a first collection and the identified parity 2 bits can be assembled in a second collection. At 606, the collected parity 1 bits can be interleaved together to generate a randomized sequence of the parity 1 bits. At 608, the collected parity 2 bits can be interleaved together to generate a randomized sequence of the parity 2 bits. At 610, the randomized sequence of the parity 1 bits and the randomized sequence of the parity 2 bits can be interlaced in an alternating manner to yield an interlaced sequence of parity 1 and 2 bits. According to another illustration, any disparate, pre-defined pattern can be used to combine the randomized sequence of the parity 1 bits with the randomized sequence of the parity 2 bits. At 612, at least a portion of the interlaced sequence of parity 1 and 2 bits can be transmitted using resources available subsequent to transfer of an entire sequence of systematic bits included in the at least one encoded block outputted by the encoder.

It will be appreciated that, in accordance with one or more aspects described herein, inferences can be made regarding employing circular buffer based rate matching. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in Close temporal proximity, and whether the events and data come from one or several event and data sources.

According to an example, one or methods presented above can include making inferences pertaining to deciphering a bit type (e.g., systematic, parity 1, parity 2). By way of further illustration, an inference can be made related to determining how to combine (e.g., interlace) the parity 1 and parity 2 bits; as such, differing weightings for each of the parity bit types can be assigned based upon such inference, for example. It will be appreciated that the foregoing examples are illustrative in nature and are not intended to limit the number of inferences that can be made or the manner in which such inferences are made in conjunction with the various embodiments and/or methods described herein.

Figure 7:
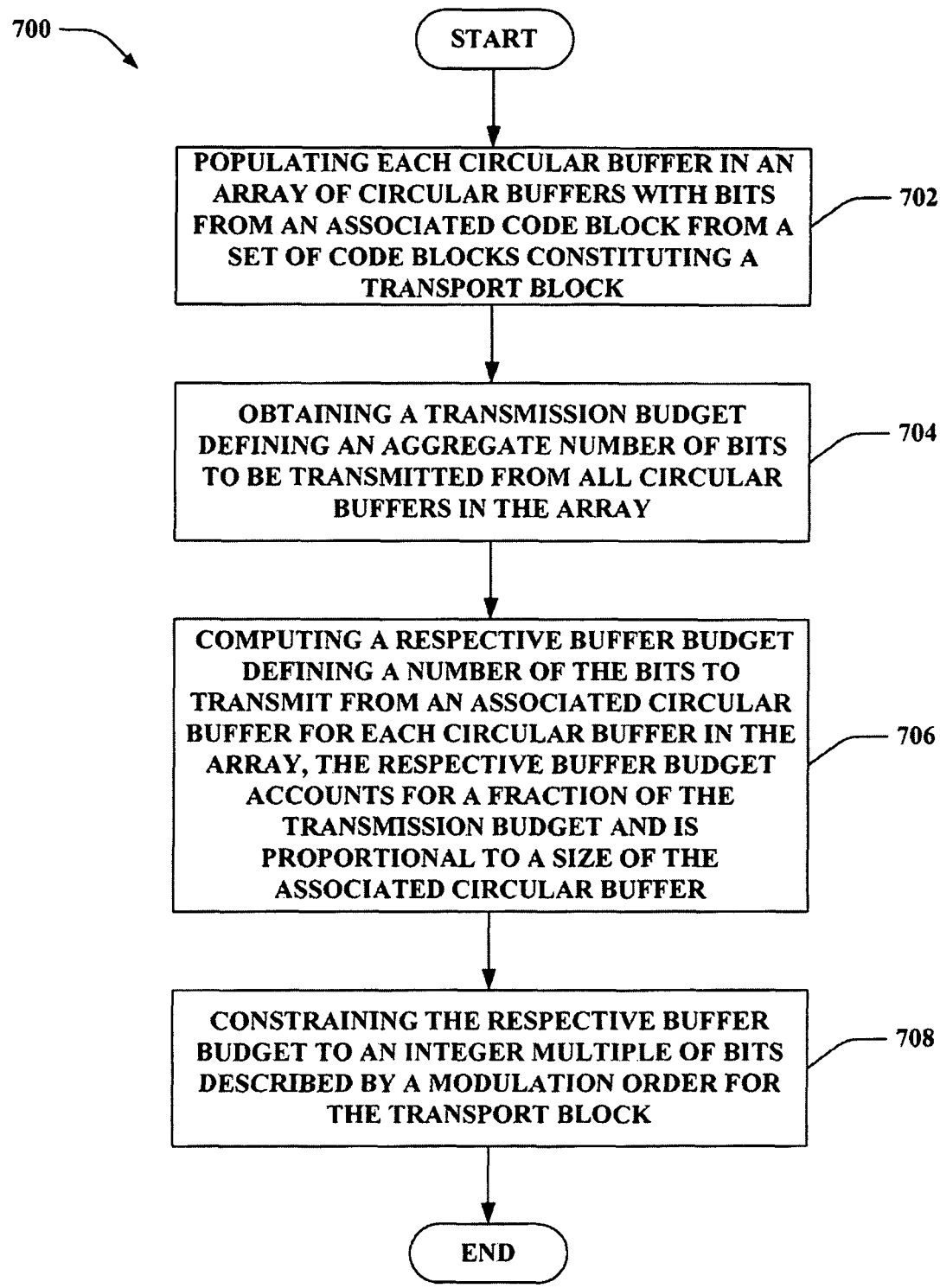
FIG. 7 is an illustration of an example methodology that facilitates employing rate matching in a wireless communication environment with multiple code block sizes for a transport block.

Now turning to FIG. 7, illustrated is a methodology 700 for facilitating rate matching a wireless communication environment with multiple code block sizes for a transport block. At 702, each circular buffer in an array of circular buffers can be populated with bits from an associated code block from a set of code blocks constituting a transport block. Thus, a given transport block can be segmented into M code blocks, where M can be substantially any integer. For each of these code blocks, an associated encoded code block can exist for storing coded data from the code block, as can an associated circular buffer for storing data from the encoded code block.

At 704, a transmission budget defining an aggregate number of bits to be transmitted from all circular buffers in the array can be obtained. Appreciably, since the array of circular buffers includes a circular buffer for each code block in the transport block, the transport budget effectively describes the number of bits that can be transmitted from a particular transport block.

Next in the description, at 706, a respective buffer budget defining a number of the bits to transmit from an associated circular buffer for each circular buffer in the array can be computed, wherein the respective buffer budget accounts for a fraction of the transmission budget and is proportional to a size of the associated circular buffer. Appreciably, the sum of all buffer budgets for a transport block can be substantially equal to the transport buffer, even though each respective buffer budget can differ in size (e.g., the number of bits to transmit) versus others based upon relative size.

Figure 8:
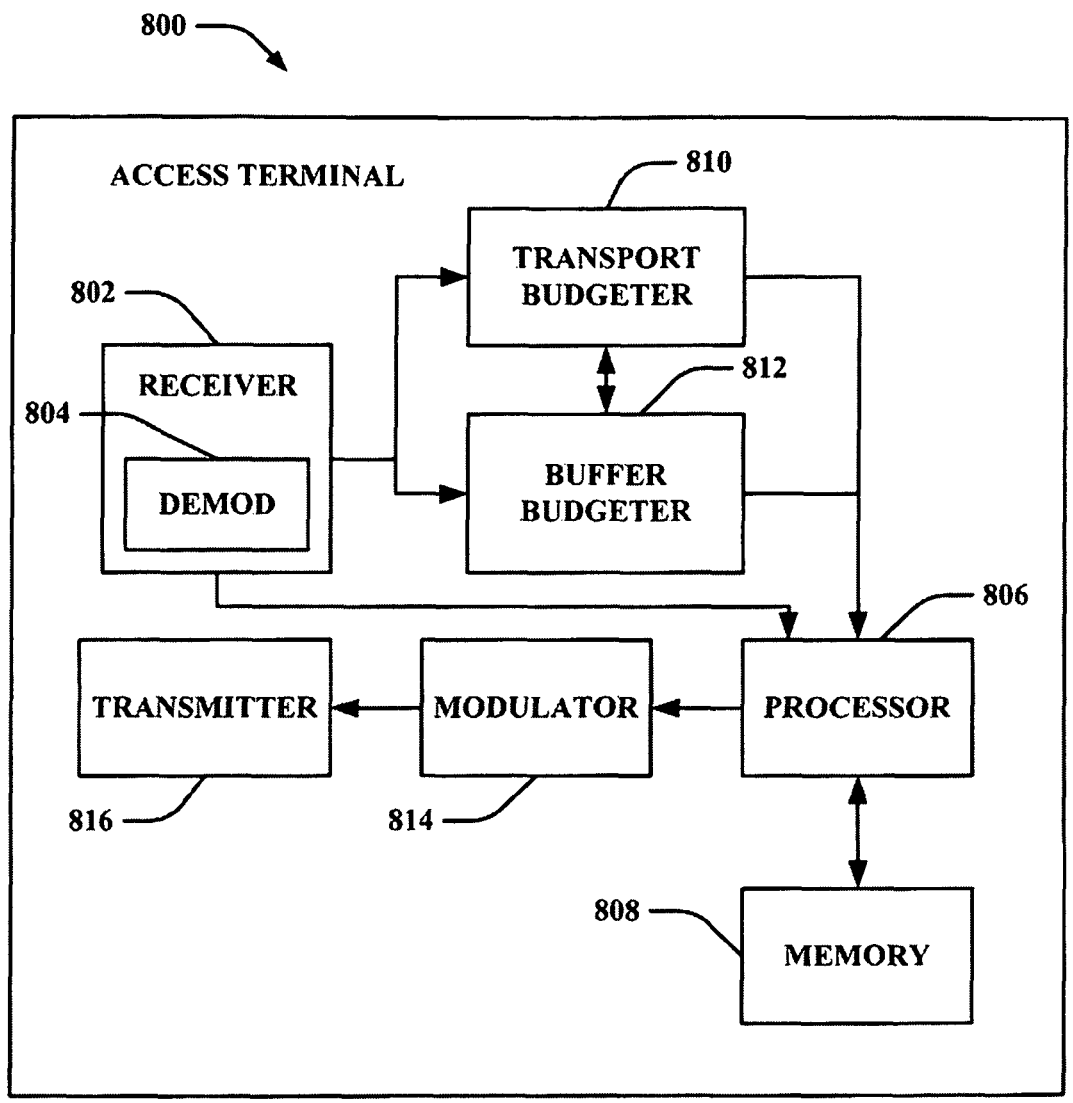
FIG. 8 is an illustration of an example access terminal that facilitates performing circular buffer based rate matching in a wireless communication system.

At 708, the respective buffer budget can be constrained to being an integer multiple of a number of bits described by a modulation order for the transport block. Put another way, the number of bits described by the buffer budget can be multiple of the modulation order. Typically, the modulation order will be 2, 4, 6 or the like, so (though not required and other examples can exist), the buffer budget will define a value that is an integer multiple of 2, 4, 6, or whatever modulation order is employed for the transport block FIG. 8 is an illustration of an access terminal 800 that facilitates performing circular buffer based rate matching in a wireless communication system. Access terminal 800 comprises a receiver 802 that receives a signal from, for instance, a receive antenna (not shown), and performs typical actions thereon (e.g., filters, amplifies, downconverts, etc.) the received signal and digitizes the conditioned signal to obtain samples. Receiver 802 can be, for example, an MMSE receiver, and can comprise a demodulator 804 that can demodulate received symbols and provide them to a processor 806 for channel estimation. Processor 806 can be a processor dedicated to analyzing information received by receiver 802 and/or generating information for transmission by a transmitter 816, a processor that controls one or more components of access terminal 800, and/or a processor that both analyzes information received by receiver 802, generates information for transmission by transmitter 816, and controls one or more components of access terminal 800.

Access terminal 800 can additionally comprise memory 808 that is operatively coupled to processor 806 and that can store data to be transmitted, received data, and any other suitable information related to performing the various actions and functions set forth herein. Memory 808 can additionally store protocols and/or algorithms associated with circular buffer based rate matching.

It will be appreciated that the data store (e.g., memory 808) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 808 of the subject systems and methods is intended to comprise, without being limited to, these and any other suitable types of memory.

Receiver 802 is further operatively coupled to transport budgeter 810 and/or buffer budgeter 812, which can be substantially similar to transport budgeter 216 of FIG. 2 and buffer budgeter 218 of FIG. 2. Moreover, although not shown, it is contemplated that access terminal 800 can include a turbo code encoder substantially similar to turbo code encoder 204 of FIG. 2, a bit type separator substantially similar to bit type separator 206 of FIG. 2, an interleaver substantially similar to interleaver 208 of FIG. 2, an interlacer substantially similar to interlacer 210 of FIG. 2, and/or a mapper substantially similar to mapper 212 of FIG. 2. Transport budgeter 810 determine, infer, detect, receive, or otherwise obtain a transport budget that can describe a number of bits to transmit for a given transport block. Thus, circular buffers, one for each code block of the transport block should collectively conform to the transport budget with respect to the total or aggregate number of bits transmitted.

However, given that block codes can be of different sizes, each circular buffer can differ in size as well and can further account for a different proportion of the total transport budget. Accordingly, buffer budgeter 812 can compute a buffer budget that can describe a number of bits of the total transport budget that can be allocated to a particular circular buffer. Buffer budgeter 812 can calculate a buffer budget for each circular buffer, wherein each buffer budget can be proportional to a size of the associated circular buffer (or associated code block or associated encoded block).

Access terminal 800 still further comprises a modulator 814 and a transmitter 816 that transmits the signal to, for instance, a base station, another access terminal, etc. Although depicted as being separate from the processor 806, it is to be appreciated that transport budgeter 810, buffer budgeter 812 and/or modulator 814 can be part of processor 806 or a number of processors (not shown).

Figure 9:
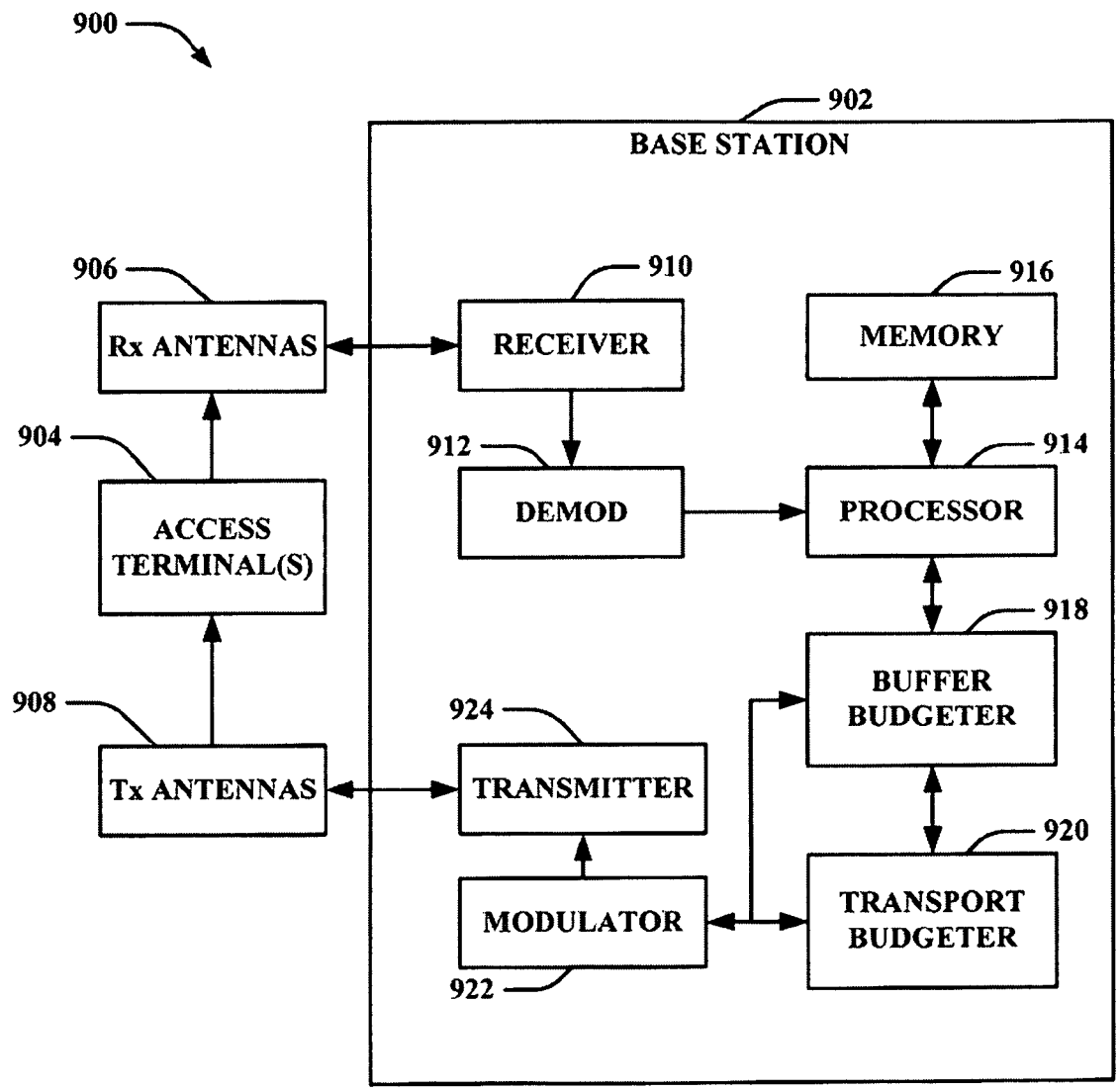
FIG. 9 is an illustration of an example system that facilitates performing circular buffer based rate matching in a wireless communication environment.

FIG. 9 is an illustration of a system 900 that facilitates performing circular buffer based rate matching in a wireless communication environment with multiple block code sizes. System 900 comprises a base station 902 (e.g., access point, . . . ) with a receiver 910 that receives signal(s) from one or more access terminals 904 through a plurality of receive antennas 906, and a transmitter 924 that transmits to the one or more access terminals 904 through a transmit antenna 908. Receiver 910 can receive information from receive antennas 906 and is operatively associated with a demodulator 912 that demodulates received information. Demodulated symbols are analyzed by a processor 914 that can be similar to the processor described above with regard to FIG. 8, and which is coupled to a memory 916 that stores data to be transmitted to or received from access terminal(s) 904 (or a disparate base station (not shown)) and/or any other suitable information related to performing the various actions and functions set forth herein. Processor 914 is further coupled to a buffer budgeter 918 that can compute a number of bits to transmit from a circular buffer, wherein the number is proportional to a size of the buffer or an associated block code. For instance, a buffer budget can be larger for circular buffers associated with larger code blocks than for circular buffers associated with smaller code blocks of a given transport block.

Buffer budgeter 918 can be operatively coupled to a transport budgeter 920 that can determine or receive an aggregate number of bits that can be transmitted for a transport block. For instance, transport budgeter 920 can obtain the aggregate transmission allocation for a transport block, of which a portion can be allocated to each circular buffer. Moreover, although not shown, it is contemplated that base station 902 can include a turbo code encoder substantially similar to turbo code encoder 204 of FIG. 2, a bit type separator substantially similar to bit type separator 206 of FIG. 2, an interleaver substantially similar to interleaver 208 of FIG. 2, an interlacer substantially similar to interlacer 210 of FIG. 2, and/or a mapper substantially similar to mapper 212 of FIG. 2. Buffer budgeter 918 and transport budgeter 920 (and/or a mapper (not shown)) can provide data to be transmitted to a modulator 922. For example, the data to be transmitted can be bits wrapped around a circular buffer that are allocated according to buffer budgeter 918 and transport budgeter 920. Modulator 922 can multiplex the frame for transmission by a transmitter 924 through antenna 908 to access terminal(s) 904. Although depicted as being separate from the processor 914, it is to be appreciated that interleaver 918, interlacer 920 and/or modulator 922 can be part of processor 914 or a number of processors (not shown).

Figure 10:
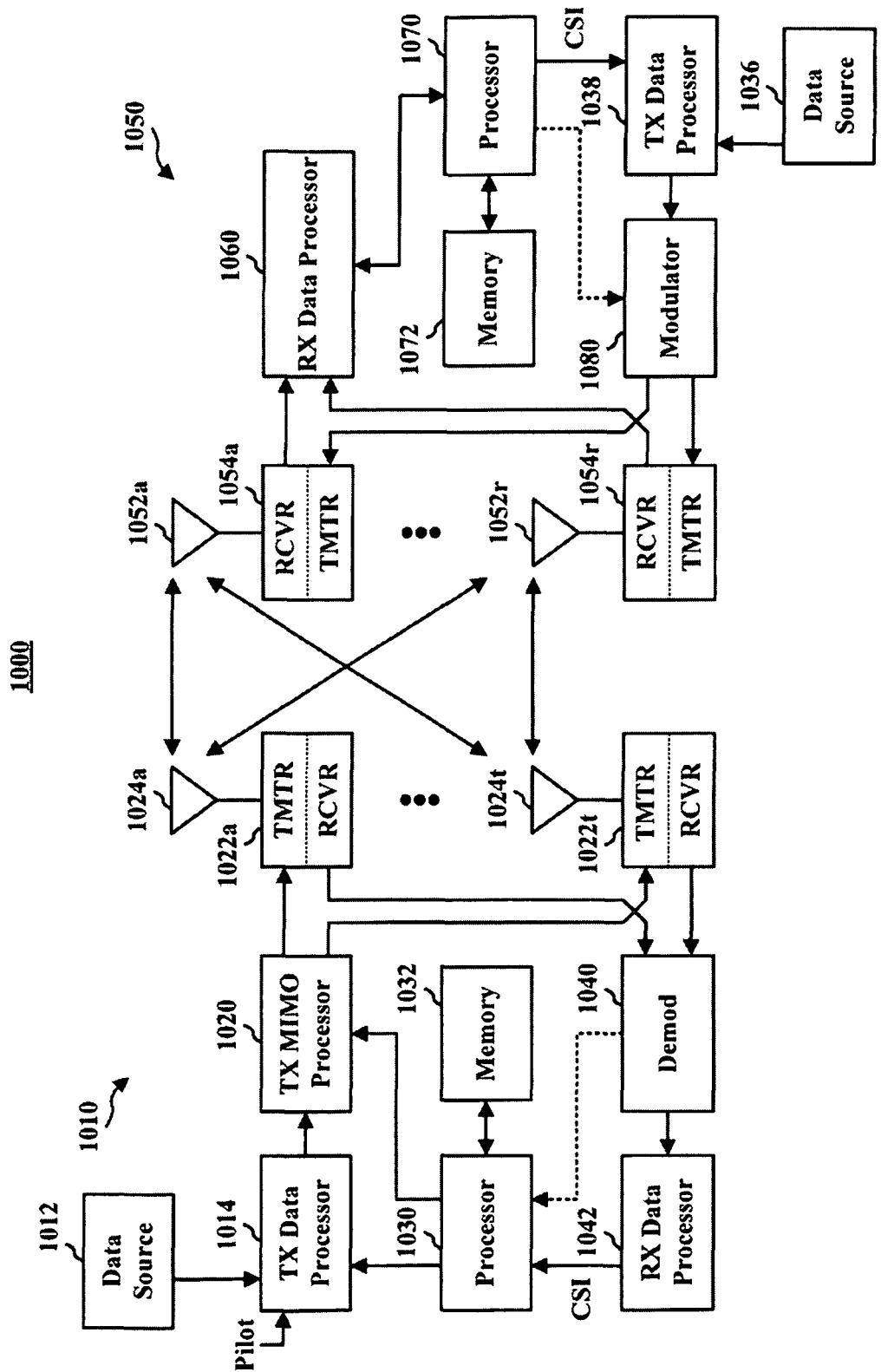
FIG. 10 is an illustration of an example wireless network environment that can be employed in conjunction with the various systems and methods described herein.

FIG. 10 shows an example wireless communication system 1,000. The wireless communication system 1000 depicts one base station 1010 and one access terminal 1050 for sake of brevity. However, it is to be appreciated that system 1000 can include more than one base station and/or more than one access terminal, wherein additional base stations and/or access terminals can be substantially similar or different from example base station 1010 and access terminal 1050 described below. In addition, it is to be appreciated that base station 1010 and/or access terminal 1050 can employ the systems (FIGS. 1-2, 8-9, and 11) and/or methods (FIGS. 4-7) described herein to facilitate wireless communication there between.

At base station 1010, traffic data for a number of data streams is provided from a data source 1012 to a transmit (TX) data processor 1014. According to an example, each data stream can be transmitted over a respective antenna. TX data processor 1014 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at access terminal 1050 to estimate channel response. The multiplexed pilot and coded data for each data stream can be modulated (e.g., symbol mapped) based on a particular modulation scheme (e.g. binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1030.

The modulation symbols for the data streams can be provided to a TX MIMO processor 1020, which can further process the modulation symbols (e.g., for OFDM). TX MIMO processor 1020 then provides $N_T$ modulation symbol streams to $N_T$ transmitters (TMTR) 1022a through 1022t. In various embodiments, TX MIMO processor 1020 applies beamforming weights to the symbols of the data streams and to the antenna from which the symbol is being transmitted.

Each transmitter 1022 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1022a through 1022t are transmitted from $N_T$ antennas 1024a through 1024t, respectively.

At access terminal 1050, the transmitted modulated signals are received by $N_R$ antennas 1052a through 1052r and the received signal from each antenna 1052 is provided to a respective receiver (RCVR) 1054a through 1054r. Each receiver 1054 conditions (e.g., filters, amplifies, and downconverts) a respective signal, digitizes the conditioned signal to provide samples, and further processes the samples to provide a corresponding "received" symbol stream.

An RX data processor 1060 can receive and process the $N_R$ received symbol streams from $N_R$ receivers 1054 based on a particular receiver processing technique to provide $N_T$ "detected" symbol streams. RX data processor 1060 can demodulate, deinterleave, and decode each, detected symbol stream to recover the traffic data for the data stream. The processing by RX data processor 1060 is complementary to that performed by TX MIMO processor 1020 and TX data processor 1014 at base station 1010.

A processor 1070 can periodically determine which available technology to utilize as discussed above. Further, processor 1070 can formulate a reverse link message comprising a matrix index portion and a rank value portion.

The reverse link message can comprise various types of information regarding the communication link, and/or the received data stream. The reverse link message can be processed by a TX data processor 1038, which also receives traffic data for a number of data streams from a data source 1036, modulated by a modulator 1080, conditioned by transmitters 1054a through 1054r, and transmitted back to base station 1010.

At base station 1010, the modulated signals from access terminal 1050 are received by antennas 1024, conditioned by receivers 1022, demodulated by a demodulator 1040, and processed by a RX data processor 1042 to extract the reverse link message transmitted by access terminal 1050. Further, processor 1030 can process the extracted message to determine which precoding matrix to use for determining the beamforming weights.

Processors 1030 and 1070 can direct (e.g., control, coordinate, manage, etc.) operation at base station 1010 and access terminal 1050, respectively. Respective processors 1030 and 1070 can be associated with memory 1032 and 1072 that store program codes and data. Processors 1030 and 1070 can also perform computations to derive frequency and impulse response estimates for the uplink and downlink, respectively.

In an aspect, logical channels are classified into Control Channels and Traffic Channels. Logical Control Channels can include a Broadcast Control Channel (BCCH), which is a DL channel for broadcasting system control information. Further, Logical Control Channels can include a Paging Control Channel (PCCH), which is a DL channel that transfers paging information. Moreover, the Logical Control Channels can comprise a Multicast Control Channel (MCCH), which is a Point-to-multipoint DL channel used for transmitting Multimedia Broadcast and Multicast Service (MBMS) scheduling and control information for one or several MTCHs. Generally, after establishing a Radio Resource Control (RRC) connection, this channel is only used by UEs that receive MBMS (e.g., old MCCH+MSCH). Additionally, the Logical Control Channels can include a Dedicated Control Channel (DCCH), which is a Point-to-point bi-directional channel that transmits dedicated control information and can be used by UEs having a RRC connection. In an aspect, the Logical Traffic Channels can comprise a Dedicated Traffic Channel (DTCH), which is a Point-to-point bi-directional channel dedicated to one UE for the transfer of user information. Also, the Logical Traffic Channels can include a Multicast Traffic Channel (MTCH) for Point-to-multipoint DL channel for transmitting traffic data.

In an aspect, Transport Channels are classified into DL and UL. DL Transport Channels comprise a Broadcast Channel (BCH), a Downlink Shared Data Channel (DL-SDCH) and a Paging Channel (PCH). The PCH can support. UE power saving (e.g. Discontinuous Reception (DRX) cycle can be indicated by the network to the UE, ... ) by being broadcasted over an entire cell and being mapped to Physical layer (PHY) resources that can be used for other control/traffic channels. The UL Transport Channels can comprise a Random Access Channel (RACH), a Request Channel (REQCH), a Uplink Shared Data Channel (UL-SDCH) and a plurality of PHY channels.

The PHY channels can include a set of DL channels and UL channels. For example, the DL PHY channels can include: Common Pilot Channel (CPICH); Synchronization Channel (SCH); Common Control Channel (CCCH); Shared DL Control Channel (SDCCH); Multicast Control Channel (MCCH); Shared UL Assignment Channel (SUACH); Acknowledgement Channel (ACKCH); DL Physical Shared Data Channel (DL-PSDCH); UL Power Control Channel (UPCCH); Paging Indicator Channel (PICH); and/or Load Indicator Channel (LICH). By way of further illustration, the UL PHY Channels can include: Physical Random Access Channel (PRACH); Channel Quality Indicator Channel (CQICH); Acknowledgement Channel (ACKCH); Antenna Subset Indicator Channel (ASICH); Shared Request Channel (SREQCH); UL Physical Shared Data Channel (UL-PSDCH); and/of Broadband Pilot Channel (BPICH).

It is to be understood that the embodiments described herein can be implemented in hardware, software, firmware, middleware, microcode, or any combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

When the embodiments are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

Figure 11:
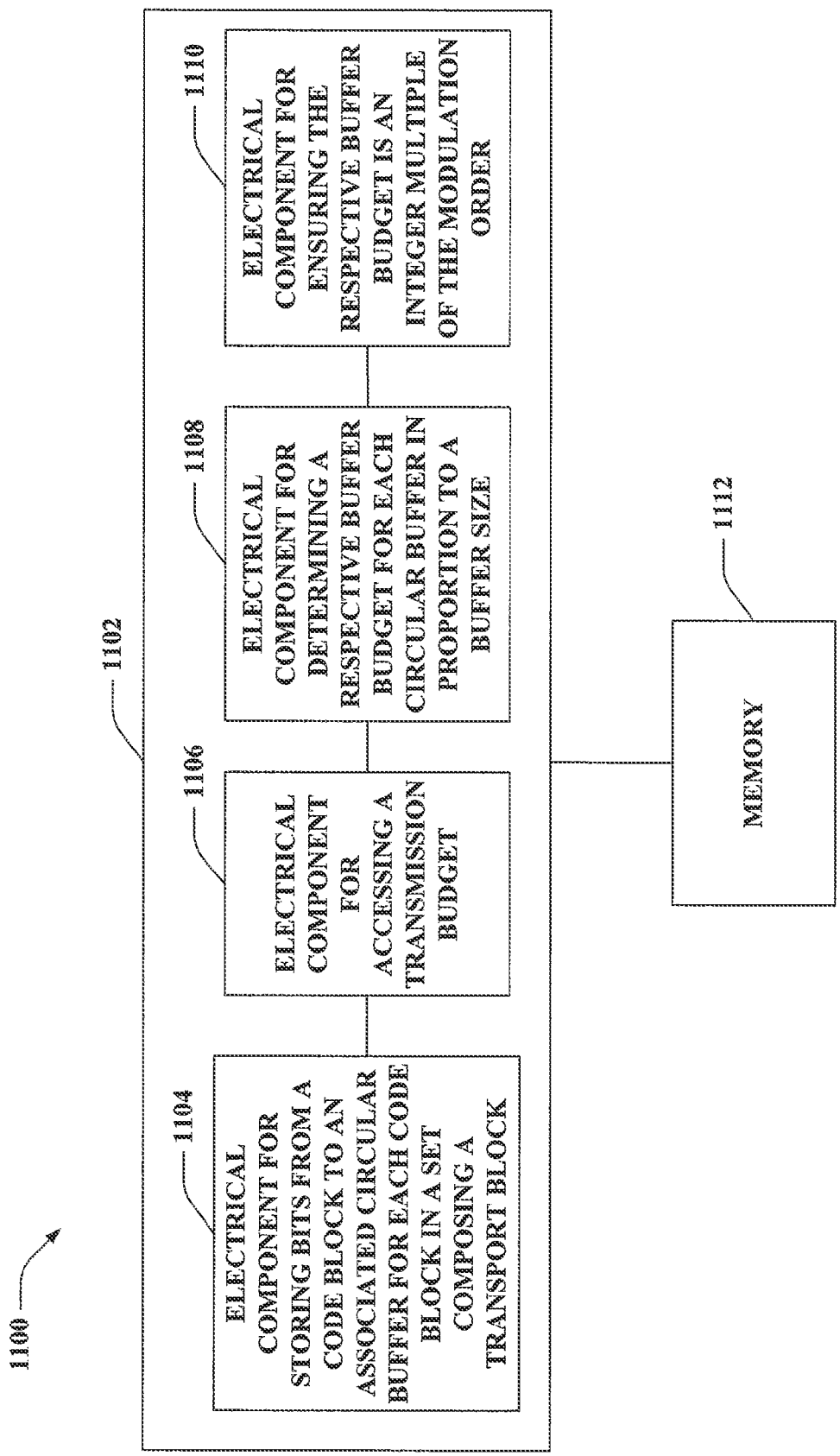
FIG. 11 is an illustration of an example system that enables employing rate matching in a wireless communication environment.

With reference to FIG. 11, illustrated is a system 1100 that enables employing rate matching in a wireless communication environment. For example, system 1100 can reside at least partially within a base station. According to another illustration, system 1100 can reside at least partially within an access terminal. It is to be appreciated that system 1100 is represented as including functional blocks, which can be functional blocks that represent functions implemented by a processor, software, or combination thereof (e.g., firmware). System 1100 includes a logical grouping 1102 of electrical components that can act in conjunction. For instance, logical grouping 1102 can include an electrical component for storing bits from a code block to an associated circular buffer for each code block in a set of code blocks composing a transport block 1104. Further, logical grouping 1102 can comprise an electrical component for accessing a transmission budget defining an aggregate number of bits to be transmitted from all circular buffers 1106. Moreover, logical grouping 1102 can include an electrical component for determining a respective buffer budget describing a number of bits to transmit from the associated circular buffer 1108. Logical grouping 1102 can also include an electrical component for ensuring the respective buffer budget is an integer multiple of a number of modulation symbols to be transmitted from the associated circular buffer 1110. For example, the number of bits transmitted from each circular buffer (e.g., in operating environments that can have different block sizes for a transport block) can be in accordance with the overarching transport budget, yet still differ between individual circular buffers in proportion to a size of the respective buffer. Moreover, the individual buffer budgets can further be constrained to transmit a number of bits that is an integer multiple of the modulation order for the transport block. Additionally, system 1100 can include a memory 1112 that retains instructions for executing functions associated with electrical components 1104, 1106, 1108, and 1110. While shown as being external to memory 1112, it is to be understood that one or more of electrical components 1104, 1106, 1108, and 1110 can exist within memory 1112.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for facilitating rate matching in a wireless communication environment, comprising:
    populating each buffer in an array of buffers with bits from an associated code block from a set of code blocks constituting a transport block;
    obtaining a transmission budget defining an aggregate number of bits to be transmitted from all buffers in the array; and
    computing a respective buffer budget defining a number of the bits to transmit from an associated buffer for each circular buffer in the array, the respective buffer budget accounts for a fraction of the transmission budget and is proportional to a size of the associated buffer, wherein the size of each buffer is substantially the same, and wherein computing the respective buffer budget comprises applying a recursive expression when respective buffer budgets for buffers of identical size do not vary.

2. The method of claim 1, further comprising constraining the respective buffer budget to an integer multiple of a number of bits described by a modulation order for the transport block.

3. The method of claim 1, further comprising indexing each buffer according to a decreasing order of priority.

4. The method of claim 1, further comprising applying the recursive expression according to an order of priority based on buffer size.

5. The method of claim 1, further comprising applying the recursive expression simultaneously for buffers of identical size.

6. The method of claim 1, further comprising applying a hybrid recursive expression when only one respective buffer budget out of all buffer budgets for buffers of identical size is permitted to vary.

7. The method of claim 1, further comprising coding and interleaving the bits in the associated code block and further interlacing a portion of the coded and interleaved bits prior to populating each buffer.

8. The method of claim 1, further comprising:
    inserting interleaved systematic bits of a code block into an associated buffer followed by inserting interlaced and interleaved parity 1 and parity 2 bits of the code block into the associated buffer.

9. The method of claim 1, wherein a number of bits transmitted from at least one of the buffers in the array of buffers is different than a number of bits transmitted from all remaining buffers in the array of buffers.

10. The method of claim 1, wherein computing the respective buffer budget comprises applying a first recursive expression when respective buffer budgets for buffers of identical size are permitted to vary.

11. A wireless communications apparatus, comprising:
a memory that retains instructions related to storing bits from a code block to an associated buffer for each code block in a set of code blocks composing a transport block, accessing a transmission budget defining an aggregate number of bits to be transmitted from all buffers, and determining a respective buffer budget describing a number of the bits to transmit from the associated buffer, the respective buffer budget accounts for a fraction of the transmission budget and is a function of a size of the associated buffer, wherein the size of each buffer is substantially the same, and wherein determining the respective buffer budget comprises applying a recursive formula when respective buffer budgets for buffers of identical size do not vary; and
a processor, coupled to the memory, configured to execute the instructions retained in the memory.

12. The wireless communications apparatus of claim 11, the memory further retains instructions related to ensuring the respective buffer budget is an integer multiple of a number of modulation symbols to be transmitted from the associated buffer.

13. The wireless communications apparatus of claim 11, the memory further retains instructions related to ordering each associated buffer according to a decreasing order of priority.

14. The wireless communications apparatus of claim 11, the memory further retains instructions related to applying the recursive formula according to an order of priority based on buffer size.

15. The wireless communications apparatus of claim 11, the memory further retains instructions related to applying the recursive formula simultaneously for buffers of identical size.

16. The wireless communications apparatus of claim 11, wherein the memory further retains instructions related to utilizing a hybrid recursive formula for determining a respective buffer budget when only one buffer budget out of all buffer budgets for buffers of a given size is allowed to vary.

17. The wireless communications apparatus of claim 11, the memory further retains instructions related to coding and interleaving the bits in the code block prior to storing to an associated buffer.

18. A wireless communications apparatus that enables employing rate matching in a wireless communication environment, comprising:
means for populating each buffer in an array of buffers with data from an associated code block of a transport block;
means for defining an aggregate amount of data to be transmitted for the transport block; and
means for calculating a respective buffer budget defining an amount of data to be transmitted from an associated buffer according to a size of the buffer relative to other buffers, wherein the size of each buffer is substantially the same, and wherein computing the respective buffer budget comprises applying a recursive expression when respective buffer budgets for buffers of identical size do not vary.

19. The wireless communications apparatus of claim 18, further comprising means for constraining the respective buffer budget to an integer multiple of a number of bits described by a modulation order for the transport block.

20. The wireless communications apparatus of claim 18, further comprising means for indexing each buffer according to a decreasing order of priority.

21. The wireless communications apparatus of claim 20, further comprising means for utilizing the decreasing order of priority for recursively applying one or more expressions for calculating the respective buffer budget.

22. The wireless communications apparatus of claim 18, further comprising means for coding and interleaving bits in a code block prior to populating each buffer.

23. A non-transitory machine-readable medium having stored thereon machine-executable instructions for:
associating each code block of a transport block with a buffer in an array of buffers;
populating the buffer in the array of buffers with bits from an associated code block;
determining a transmission budget defining an aggregate number of bits to be transmitted from all buffers in the array; and
computing a buffer budget defining a number of the bits to transmit from the buffer recursively for each buffer in the array, the buffer budget accounting for a percentage of the transmission budget and is proportional to a size of the buffer, wherein the size of each buffer is substantially the same, and wherein computing the buffer budget comprises applying a recursive expression when respective buffer budgets for buffers of identical size do not vary.

24. The non-transitory machine-readable medium of claim 23, the machine-executable instructions further comprise instructions for ensuring the buffer budget is an integer multiple of a number of modulation symbols to be transmitted from the buffer.

25. The non-transitory machine-readable medium of claim 23, the machine-executable instructions further comprise instructions for prioritizing each buffer in the array according to a decreasing order of priority.

26. The non-transitory machine-readable medium of claim 23, the machine-executable instructions further comprise instructions for establishing the order of priority based on buffer size.

27. The non-transitory machine-readable medium of claim 23, the machine-executable instructions further comprise instructions for applying the recursive expression simultaneously for buffers of identical size.

28. The non-transitory machine-readable medium of claim 23, wherein the machine-executable instructions further comprise instructions for
applying a hybrid recursive expression when only one buffer budget out of all buffer budgets for buffers of identical size is permitted to vary.

29. The non-transitory machine-readable medium of claim 23, the machine-executable instructions further comprise instructions for coding and interleaving the bits in the code block and further interlacing a portion of the coded and interleaved bits prior to populating the buffer.

30. In a wireless communications system, an apparatus comprising:
a processor configured to:
store information included in a code block to an associated buffer in an array of buffers for each code block of a transport block;
configure a transmission budget that defines an aggregate number of bits to be transmitted from all code blocks; and
determine a block budget that defines a number of the bits to transmit from the code block, the block budget accounts for a portion of the transmission budget and is a function of a size of the code block relative to other code blocks in the transport block, wherein the size of each buffer is substantially the same, and wherein determining the block buffer budget comprises applying a recursive expression when respective buffer budgets for buffers of identical size do not vary; and a memory coupled to the processor.

* * * * *